US008901656B2

(12) United States Patent
Aoki et al.

(10) Patent No.: US 8,901,656 B2
(45) Date of Patent: Dec. 2, 2014

(54) SEMICONDUCTOR WAFER, FIELD-EFFECT TRANSISTOR, METHOD OF PRODUCING SEMICONDUCTOR WAFER, AND METHOD OF PRODUCING FIELD-EFFECT TRANSISTOR

(71) Applicants: Sumitomo Chemical Company, Limited, Tokyo (JP); The University of Tokyo, Tokyo (JP); National Institute of Advanced Industrial Science and Technology, Tokyo (JP)

(72) Inventors: Takeshi Aoki, Tsukuba (JP); Hisashi Yamada, Tsukuba (JP); Noboru Fukuhara, Tsukuba (JP); Masahiko Hata, Tsukuba (JP); Masafumi Yokoyama, Tokyo (JP); SangHyeon Kim, Tokyo (JP); Mitsuru Takenaka, Tokyo (JP); Shinichi Takagi, Tokyo (JP); Tetsuji Yasuda, Tsukuba (JP)

(73) Assignees: Sumitomo Chemical Company, Limited, Tokyo (JP); The University of Tokyo, Tokyo (JP); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 14/015,775

(22) Filed: Aug. 30, 2013

(65) Prior Publication Data
US 2013/0341721 A1 Dec. 26, 2013

Related U.S. Application Data

(63) Continuation-in-part of application No. PCT/JP2012/001477, filed on Mar. 2, 2012.

(30) Foreign Application Priority Data

Mar. 2, 2011 (JP) ................................ 2011-045510

(51) Int. Cl.
H01L 27/12 (2006.01)
H01L 21/20 (2006.01)
(Continued)

(52) U.S. Cl.
CPC ...... *H01L 29/78681* (2013.01); *H01L 21/2007* (2013.01); *H01L 29/78* (2013.01);
(Continued)

(58) Field of Classification Search
None
See application file for complete search history.

(56) References Cited

U.S. PATENT DOCUMENTS 6,963,090 B2    11/2005  Passlack et al.
2006/0246688 A1 11/2006  Sekiguchi et al.
(Continued)

FOREIGN PATENT DOCUMENTS

JP   05-327127 A   12/1993
JP   2006-012986 A  1/2006
(Continued)

OTHER PUBLICATIONS

Atomic diffusion and band lineups at In0.53Ga0.47As-on-InP heterointerfaces; P. E. Smitha; Department of Physics, The Ohio State University, Columbus, Ohio 43210; Jul. 25, 2005.*

(Continued)

*Primary Examiner* — Fernando L Toledo
*Assistant Examiner* — Robert Bachner
(74) *Attorney, Agent, or Firm* — Sughrue Mion, PLLC

(57) ABSTRACT

Provided is a semiconductor wafer including a base wafer, a first insulating layer, and a semiconductor layer. Here, the base wafer, the first insulating layer and the semiconductor layer are arranged in an order of the base wafer, the first insulating layer and the semiconductor layer, the first insulating layer is made of an amorphous metal oxide or an amorphous metal nitride, the semiconductor layer includes a first crystal layer and a second crystal layer, the first crystal layer and the second crystal layer are arranged in an order of the first crystal layer and the second crystal layer in such a manner that the first crystal layer is positioned closer to the base wafer, and the electron affinity $E_{a1}$ of the first crystal layer is larger than the electron affinity $E_{a2}$ of the second crystal layer.

9 Claims, 31 Drawing Sheets

(51) Int. Cl.
   *H01L 29/78* (2006.01)
   *H01L 29/66* (2006.01)
   *H01L 21/762* (2006.01)
   *H01L 29/786* (2006.01)
   *H01L 29/778* (2006.01)
   *H01L 29/20* (2006.01)
   *H01L 29/51* (2006.01)

(52) U.S. Cl.
   CPC .... *H01L 29/66742* (2013.01); *H01L 29/66462* (2013.01); *H01L 29/517* (2013.01); *H01L 21/76254* (2013.01); *H01L 29/7786* (2013.01); *H01L 29/6631* (2013.01); *H01L 29/7783* (2013.01); *H01L 21/76256* (2013.01); *H01L 29/2003* (2013.01); *H01L 29/778* (2013.01)
   USPC .......................................... 257/347; 438/458

(56) References Cited

U.S. PATENT DOCUMENTS

| | | | |
|---|---|---|---|
| 2009/0283756 A1* | 11/2009 | Hellings et al. | 257/24 |
| 2009/0298272 A1* | 12/2009 | Rhodes | 438/587 |
| 2011/0006375 A1* | 1/2011 | Ramin et al. | 257/369 |
| 2011/0018033 A1 | 1/2011 | Takenaka et al. | |

FOREIGN PATENT DOCUMENTS

| | | |
|---|---|---|
| JP | 2007-096126 A | 4/2007 |
| JP | 2009-238955 A | 10/2009 |
| JP | 2010-010663 A | 1/2010 |
| JP | 2010-232568 A | 10/2010 |
| JP | 2011-009722 A | 1/2011 |

OTHER PUBLICATIONS

Machine translation of Yokoyama Japanese Patent Document JP 2010-232568, Translation obtained May 1, 2014.*

F. Ren, et al., "Demostration of Enhancement-Mode p- and n-channel GaAs Mosfets with Ga2O3(Gd2O3) as Gate Oxide", Solid-State Electronics, 1997, pp. 1751-1753, vol. 41, No. 11.

Hock-Chun Chin, et al., "Silane-Ammonia Surface Passivation for Gallium Arsenide Surface-Channel n-MOSFETs", IEEE Electron Device Letters, 2009, pp. 1-3.

S. Arabasz, et al., "XPS study of surface chemistry of epiready GaAs(1 0 0) surface after (NH4)2Sx passivation", Science Direct, 2006, pp. 888-893, vol. 80.

Narayan Chandra Paul, et al., "Oxidation of InAIAs and Its Application to Gate Insulator of InAIAs/InGaAs Metal Oxide Semiconductor High Electron Mobility Transistor", Japanese Journal of Applied Physics, 2005, pp. 1174-1180, vol. 44, No. 3.

Czornomaz et al., "Self-aligned S/D regions for InGaAs MOSFETs", Proceedings of the European Solid-State Device Research Conference held Sep. 12-16, 2011, pp. 219-222.

IED Meeting Session 13 (list of sessions for Dec. 6, 2011).

IED Meeting 2011 Technical Digest, Washington D.C., Dec. 5-7, 2011.

Kim et al., "Enhancement Technologies and Physical Understanding of Electron Mobility in III-V n-MOSFETs with Strain and MOS Interface Buffer Engineering", IED Meeting 2011, Washington D.C., presented Dec. 6, 2011.

* cited by examiner

SEMICONDUCTOR WAFER, FIELD-EFFECT TRANSISTOR, METHOD OF PRODUCING SEMICONDUCTOR WAFER, AND METHOD OF PRODUCING FIELD-EFFECT TRANSISTOR

The contents of the following Japanese patent applications are incorporated herein by reference:
No. 2011-045510 filed in JP on Mar. 2, 2011, and
PCT/JP2012/001477 filed on Mar. 2, 2012.

BACKGROUND

1. Technical Field

The present invention relates to a semiconductor wafer, a field-effect transistor, a method of producing a semiconductor wafer, and a method of producing a field-effect transistor. The present patent application is related to a research sponsored by 2009, NEDO "Nanoelectronics Semiconductor New Material/New Structure Nanoelectronic Device Technological Development, Research and Development of Group III-V Semiconductor Channel Transistor Technology on Silicon Platform" and filed under the Industrial Technology Enhancement Act, Article 19.

2. Related Art

A Group III-V MISFET (metal-insulator-semiconductor field-effect transistor) utilizing a Group III-V compound semiconductor layer as a channel material exhibits a high electron mobility and is expected to serve as a switching device suitable for high-frequency and high-power operation. A Group III-V MISFET is considered to be a promising alternative of a Si CMOSFET (complementary metal-oxide-semiconductor field-effect transistor) utilizing silicon for a channel material. When Group III-V MISFETs are used to constitute complementary elements to produce an LSI (Large Scale Integration), it is preferable to form the Group III-V MISFETs on a silicon wafer so as to use the existing production equipment and the existing production process.

Non-Patent Documents 1 and 2 disclose a MISFET utilizing a Group III-V compound semiconductor material for the channel layer. Non-Patent Document 3 discloses that the energy level existing at the interface between the semiconductor and the insulator (herein, referred to as "the interface state") may be effectively reduced by, for example, treating the compound semiconductor surface with an ammonia sulfide solution.

Non-Patent Document 1: Ren, F. et al. Demonstration of enhancement-mode p- and n-channel GaAs MOSFETs with $Ga_2O_3(Gd_2O_3)$ As gate oxide. Solid State Electron. 41, 1751-1753 (1997).

Non-Patent Document 2: Chin, H. C. et al. Silane-ammonia surface passivation for gallium arsenide surface-channel n-MOSFETs. IEEE Electron Device Lett. 30, 110-112 (2009).

Non-Patent Document 3: S. Arabasz, et al., Vac. Vol. 80 (2006), Page 888

To produce a Group III-V MISFET on a silicon wafer, a Group III-V compound semiconductor layer needs to be formed on the silicon wafer. However, there is a large difference in lattice constant between the Group III-V compound semiconductor layer and the silicon wafer. Therefore, it is difficult to form a high-quality Group III-V compound semiconductor layer by epitaxial growth.

In response, a Group III-V compound semiconductor layer may be formed on a silicon wafer using a direct wafer bonding (DWB) method, which is known as an optical device integration technology, in other words, by directly bonding wafers to each other. When the DWB method is employed, however, the Group III-V compound semiconductor layer may experience damages, for example, generation of crystal defects after the bonding process. When the damage is too serious, the Group III-V compound semiconductor layer can be difficult to be used as a channel material of the MISFET. In particular, a Group III-V compound semiconductor layer is more obviously damaged in the case of an ultra-thin-body MISFET having an extremely thin Group III-V compound semiconductor layer.

There is also a strong demand for further improvement of the performance of Group III-V MISFETs. In particular, it is highly requested to achieve high carrier mobility. An interface state exists at the interface between a channel layer and a gate insulator layer. If carriers are trapped in the interface state, the carrier mobility is degraded due to coulomb scattering and other reasons. Accordingly, it is desirable to further lower the interface state. Furthermore, irrespective of a certain high interface state density at a MIS interface, it is desirable to further enhance the performance of FETs by taking measures to minimize the influence of the interface state existing at the MIS interface.

An objective of the present invention is to provide a Group III-V MISFET having a high carrier mobility by reducing the damage to be experienced by a Group III-V compound semiconductor layer when the DWB method is employed and the Group III-V compound semiconductor layer is bonded to a wafer and mitigating the influences of the experienced damage and the interface state.

SUMMARY

For a solution to the above-mentioned problems, according to the first aspect related to the present invention, provided is one exemplary semiconductor wafer including a base wafer, a first insulating layer, and a semiconductor layer. Here, the base wafer, the first insulating layer and the semiconductor layer are arranged in an order of the base wafer, the first insulating layer and the semiconductor layer, the first insulating layer is made of an amorphous metal oxide or an amorphous metal nitride, the semiconductor layer includes a first crystal layer and a second crystal layer, the first crystal layer and the second crystal layer are arranged in an order of the first crystal layer and the second crystal layer in such a manner that the first crystal layer is positioned closer to the base wafer, and the electron affinity $E_{a1}$ of the first crystal layer is larger than the electron affinity $E_{a2}$ of the second crystal layer.

The semiconductor layer may further include a third crystal layer. In this case, the first crystal layer, the second crystal layer and the third crystal layer are arranged in an order of the third crystal layer, the first crystal layer and the second crystal layer in such a manner that the third crystal layer is positioned closest to the base wafer, and the electron affinity $E_{a3}$ of the third crystal layer is smaller than the electron affinity $E_{a1}$ of the first crystal layer. The first crystal layer can be, for example, made of $In_{x1}Ga_{1-x1}As$ ($0<x1\leq1$), the second crystal layer can be, for example, made of $In_{x2}Ga_{1-x2}As$ ($0\leq x2<1$), the third crystal layer can be, for example, made of $In_{x3}Ga_{1-x3}As$ ($0\leq x3<1$), and the relation of x1>x2 and the relation of x1>x3 are preferably satisfied. The semiconductor layer preferably has the thickness of 20 nm or less.

For a solution to the above-mentioned problems, according to the second aspect related to the present invention, provided is one exemplary field-effect transistor including the semiconductor layer of the above-described semiconductor wafer and a source electrode and a drain electrode that are electrically connected to the semiconductor layer of the semiconductor wafer.

The semiconductor layer includes a source region in contact with the source electrode or a drain region in contact with the drain electrode. In this case, the source region or the drain region may contain an alloy of (i) at least one type of atom selected from the group consisting of a Group III atom and a Group V atom that make the semiconductor layer and (ii) a metal atom. The metal atom is preferably a nickel atom. The field-effect transistor preferably includes a gate electrode on a side of the semiconductor layer that faces away from the base wafer, and an interface of the source region that is positioned closer to the drain region and an interface of the drain region that is positioned closer to the source region are formed in an under-gate electrode region that is a region of the semiconductor layer that is sandwiched between the gate electrode and the base wafer. In this manner, a planar MOSFET having a channel length of 100 nm or less can be produced. When the field-effect transistor is an n-channel field-effect transistor, the source region or the drain region may further contain a donor impurity atom. When the field-effect transistor is a p-channel field-effect transistor, the source region or the drain region may further contain an acceptor impurity atom.

For a solution to the above-mentioned problems, according to the third aspect related to the present invention, provided is one exemplary method for producing a semiconductor wafer. The method includes forming a semiconductor layer on a semiconductor layer-forming wafer by an epitaxial crystal growth method, forming a first insulating layer on the semiconductor layer by an atomic layer deposition method, bonding a base wafer onto the first insulating layer, and removing the semiconductor layer-forming wafer from the semiconductor layer. Here, said forming a semiconductor layer includes forming a second crystal layer on the semiconductor layer-forming wafer by an epitaxial crystal growth method, and after said forming a second crystal layer, forming a first crystal layer on the second crystal layer by an epitaxial crystal growth method, and the electron affinity $E_{a1}$ of the first crystal layer is larger than the electron affinity $E_{a2}$ of the second crystal layer.

Said forming a semiconductor layer may further include, after said forming a first crystal layer, forming a third crystal layer on the first crystal layer by an epitaxial crystal growth method, and the electron affinity $E_{a3}$ of the third crystal layer is smaller than the electron affinity $E_{a1}$ of the first crystal layer.

For a solution to the above-mentioned problems, according to the fourth aspect related to the present invention, provided is one exemplary method for producing a field-effect transistor. The method includes forming a second insulating layer by an atomic layer deposition method on the semiconductor layer of the semiconductor wafer produced by a method for producing a semiconductor wafer comprising: forming a semiconductor layer on a semiconductor layer-forming wafer by an epitaxial crystal growth method; forming a first insulating layer on the semiconductor layer by an atomic layer deposition method; bonding a base wafer onto the first insulating layer; and removing the semiconductor layer-forming wafer, wherein the forming a semiconductor layer includes: forming a second crystal layer on the semiconductor layer-forming wafer by an epitaxial crystal growth method; and after the forming a second crystal layer, forming a first crystal layer on the second crystal layer by an epitaxial crystal growth method, and the electron affinity $E_{a1}$ of the first crystal layer is larger than the electron affinity $E_{a2}$ of the second crystal layer, forming a gate electrode on the second insulating layer, etching a portion of the second insulating layer that is other than a region in which the gate electrode is formed, thereby forming an opening reaching the semiconductor layer, forming a metal film in contact with a portion of the semiconductor layer that is exposed through the opening, and thermally treating the metal film, thereby forming at least one of a source region and a drain region in the portion of the semiconductor layer that is in contact with the metal film.

In said forming at least one of the source region and the drain region, one or more conditions selected from the temperature of the thermal treatment and the duration of the thermal treatment can be controlled in such a manner that one or more interfaces selected from an interface of the source region that is positioned closer to the drain region and an interface of the drain region that is positioned closer to the source region can be positioned in an under-gate electrode region that is a region of the semiconductor layer that is sandwiched between the gate electrode and the base wafer.

DESCRIPTION OF EXEMPLARY EMBODIMENTS

Figure 1:
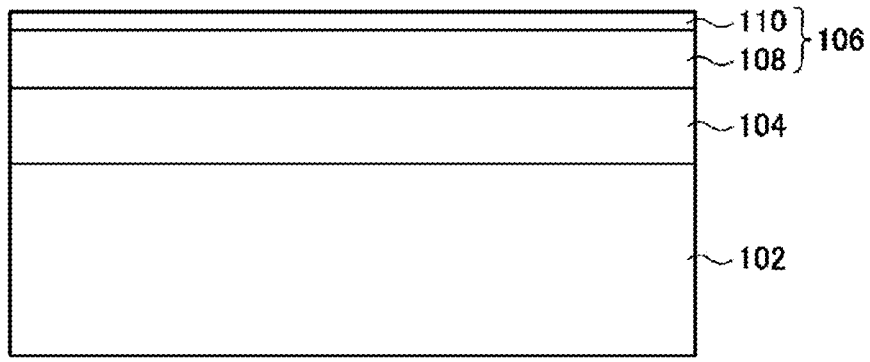
FIG. 1 shows the cross-section of a semiconductor wafer 100.

FIG. 1 illustrates the cross-section of a semiconductor wafer 100. The semiconductor wafer 100 includes a base wafer 102, a first insulator layer 104, and a semiconductor layer 106. The base wafer 102, the first insulator layer 104, and the semiconductor layer 106 are arranged in the order of the base wafer 102, the first insulator layer 104, and the semiconductor layer 106.

The base wafer 102 is, for example, a wafer whose surface is made of silicon crystal. The wafer whose surface is made of silicon crystal is, for example, a silicon wafer or a silicon-on-insulator (SOI) wafer and the silicon wafer is a preferable choice due to its low cost from the perspective of production. When the base wafer 102 is a wafer whose surface is made of silicon crystal, the existing production apparatuses and the existing production processes can be employed, which can streamline the research and development and the production. The base wafer 102 is not limited to a wafer whose surface is made of silicon crystal, and may be an insulator wafer such as a glass wafer and a ceramics wafer, an electrically conductive wafer such as a metal wafer, or a semiconductor wafer such as a silicon carbide wafer.

The first insulator layer 104 is made of an amorphous metal oxide or an amorphous metal nitride. The first insulator layer 104 is, for example, a layer made of at least one material selected from among $Al_2O_3$, $SiO_2$, AlN, AlON, $HfO_2$, HfSiON, $ZrO_2$, $SiN_x$ (for example, $Si_3N_4$), and $Ta_2O_5$, or a laminate constituted by two layers made of at least two different materials selected from the above-described materials.

As described later, the semiconductor layer 106 is formed on the base wafer 102 with the first insulator layer 104 interposed therebetween by means of a bonding method. Accordingly, the first insulator layer 104 desirably has a flat surface. The first insulator layer 104 is preferably made of a metal oxide or a metal nitride obtained by atomic layer deposition (ALD) or of $SiO_2$ obtained by thermal oxidation. Surface flatness can be evaluated by a root mean square (RMS) value of surface roughness observed using an atomic force microscope (AFM). Here, the RMS value of the surface of the first insulator layer 104 is preferably 1 nm or less. When the first insulator layer 104 is formed using atomic layer deposition (ALD), the first insulator layer 104 can have a flat surface, be amorphous and be constituted by one or more layers made of one or more materials selected from among $Al_2O_3$, $SiO_2$, AlN, AlON, $HfO_2$, HfSiON, $ZrO_2$, $SiN_x$ (for example, $Si_3N_4$), and $Ta_2O_5$. When the first insulator layer 104 is formed by thermal oxidation, the first insulator layer 104 can be formed as an amorphous $SiO_2$ layer having a flat surface. Since $SiO_2$ and $Al_2O_3$ exhibit high thermal stability, the thermal stability of the first insulator layer 104 can be enhanced when the first insulator layer 104 is formed by one or more insulator layers made of one or more materials selected from among $SiO_2$ and $Al_2O_3$. Thus, $SiO_2$ and $Al_2O_3$ are more preferable choices. Here, the thermal stability indicates that a subsequent step in the production process can be performed at a high wafer temperature and is an advantageous property from the perspective of the production process.

If the base wafer 102 and the semiconductor layer 106 are directly bonded together, stress may be generated due to the difference in lattice constant between the base wafer 102 and the semiconductor layer 106 and the stress may generate crystal defects in the semiconductor layer 106. To address this issue, the semiconductor wafer 100 relating to the present exemplary embodiment has the first insulator layer 104 made of an amorphous metal oxide or an amorphous metal nitride between the base wafer 102 and the semiconductor layer 106. Since the first insulator layer 104 does not have a crystal structure, the stress due to the difference in lattice constant between the base wafer 102 and the semiconductor layer 106 is mitigated in the semiconductor wafer 100 relating to the present exemplary embodiment. Thus, crystal defects are prevented from being generated in the semiconductor layer 106. As discussed above, when the amorphous first insulator layer 104 is interposed between the base wafer 102 and the semiconductor layer 106, the semiconductor layer 106 is less damaged during the production process.

The semiconductor layer 106 is made of a Group III-V compound semiconductor. When the semiconductor wafer 100 has the semiconductor layer 106 made of a Group III-V compound semiconductor, a MISFET with a high mobility and high performance can be formed on the base wafer 102.

The thickness of the semiconductor layer 106 preferably falls within the range of 20 nm or less. When the semiconductor layer 106 has the thickness of 20 nm or less, an ultrathin-body MISFET can be obtained. An ultrathin-body MISFET can reduce the short channel effects and leakage currents. The thickness of the semiconductor layer 106 is more preferably 10 nm or less.

When the first insulator layer 104 is in contact with the semiconductor layer 106, the semiconductor layer 106 may be sulfur-terminated at the plane in contact with the first insulator layer 104. This can lower the interface state density at the interface between the first insulator layer 104 and the semiconductor layer 106.

The semiconductor layer 106 includes a first crystal layer 108 and a second crystal layer 110. The first crystal layer 108 and the second crystal layer 110 are arranged in such a manner that the first crystal layer 108 is positioned closer to the base wafer 102 than the second crystal layer 110 is. The first crystal layer 108 lattice matches or pseudo-lattice matches the second crystal layer 110. The first crystal layer 108 and the second crystal layer 110 are formed in such a manner that the electron affinity $E_{a1}$ of the first crystal layer 108 is larger than the electron affinity $E_{a2}$ of the second crystal layer 110. When the electron affinity $E_{a1}$ of the first crystal layer 108 is larger than the electron affinity $E_{a2}$ of the second crystal layer 110, more carrier electrons are distributed in the first crystal layer 108. In other words, even when an insulator layer is formed on the second crystal layer 110 and an interface state is created at the interface between the insulator layer and the second crystal layer 110, the carrier electrons are prevented from being scattered due to the interface state. Therefore, when fabricating a semiconductor device using the semiconductor layer 106 as a channel layer, the electron mobility in the channel layer can be high.

The first crystal layer 108 is, for example, made of InGaAs or InAs, in which case the second crystal layer 110 is, for example, made of InGaAsP. The first crystal layer 108 is, for example, made of $In_{x1}Ga_{1-x1}As$ ($0<x1\leq1$), in which case the second crystal layer 110 is, for example, made of $In_{x2}Ga_{1-x2}As$ ($0\leq x2<1$, $x1>x2$). The first crystal layer 108 is, for example, made of $In_{x1}Ga_{1-x1}As$ ($0.53\leq x1\leq 1$), in which case the second crystal layer 110 is, for example, made of $In_{x2}Ga_{1-x2}As$ ($0\leq x2<0.53$). The first crystal layer 108 is, for example, made of $In_{0.7}Ga_{0.3}As$, in which case the second crystal layer 110 is, for example, made of $In_{0.3}Ga_{0.7}As$. The first crystal layer 108 is, for example, made of InAs, in which case the second crystal layer 110 is, for example, made of $In_{0.3}Ga_{0.7}As$.

The thickness of the first crystal layer 108 can be within the range of 10 nm or less, in particular, preferably within the range of 5 nm or less. The thickness of the second crystal layer 110 can be within the range of 10 nm or less, in particular, preferably within the range of 2 nm to 5 nm. The second crystal layer 110 may be at least partially doped with impurities.

Figure 2:
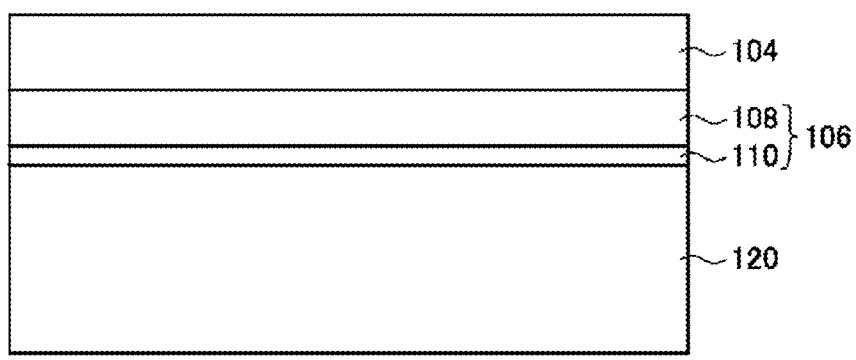
FIG. 2 shows the cross-section observed during the production process of the semiconductor wafer 100.
Figure 3:
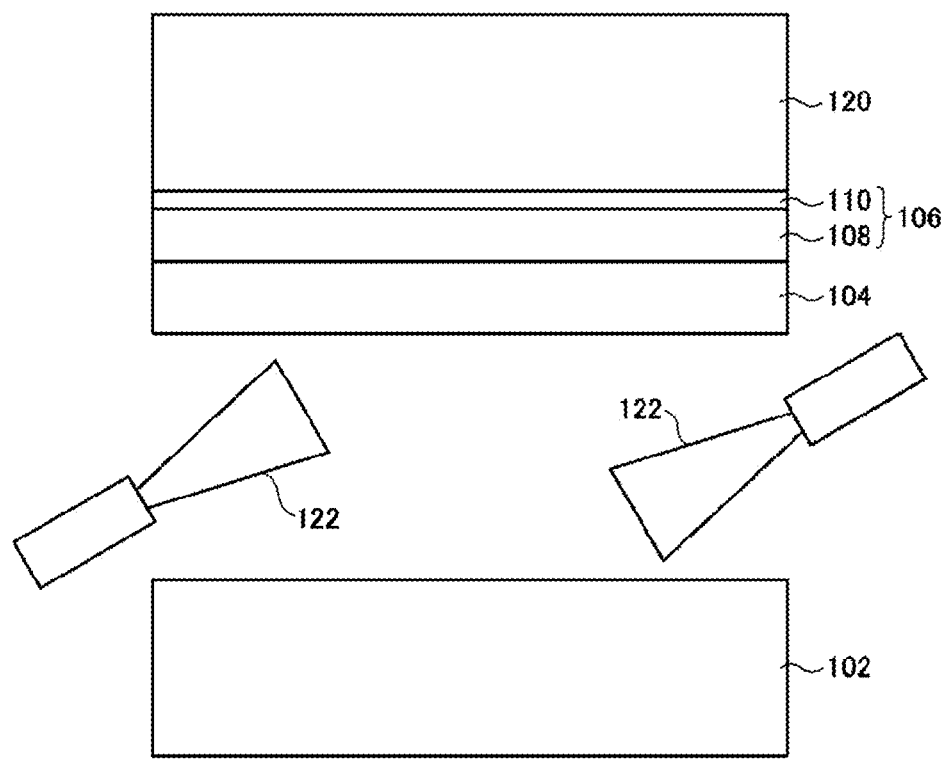
FIG. 3 shows the cross-section observed during the production process of the semiconductor wafer 100.
Figure 4:
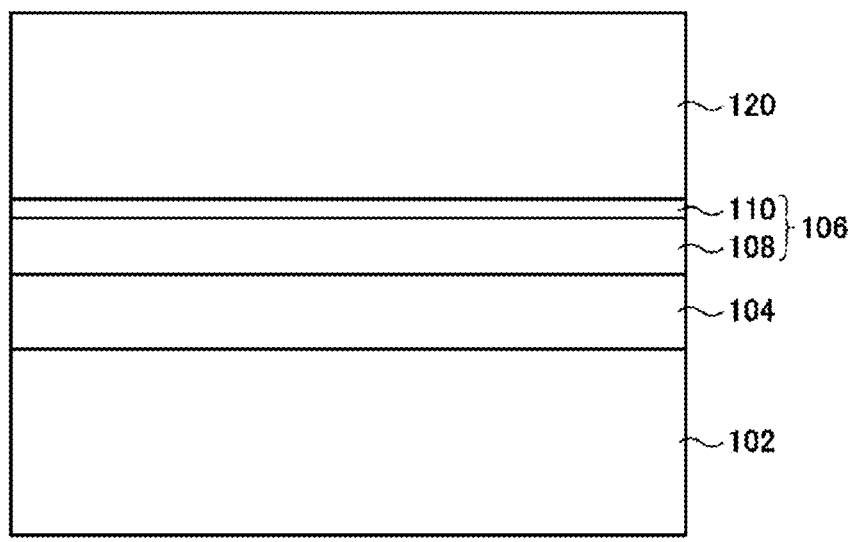
FIG. 4 shows the cross-section observed during the production process of the semiconductor wafer 100.

FIGS. 2 to 4 show the cross-section observed during the production process of the semiconductor wafer 100. As shown in FIG. 2, a semiconductor layer-forming wafer 120 is provided, and the semiconductor layer 106 is formed by epitaxial growth on the semiconductor layer-forming wafer 120. After this, the first insulator layer 104 is formed by atomic layer deposition on the semiconductor layer 106.

The semiconductor layer-forming wafer 120 is, for example, an InP wafer. When the semiconductor layer-forming wafer 120 is an InP wafer, the Group III-V compound semiconductor layer 106 can achieve high quality.

The semiconductor layer 106 is formed in such a manner that the second crystal layer 110 is first formed by epitaxial growth and the first crystal layer 108 is then formed by epitaxial growth. Here, the first crystal layer 108 and the second crystal layer 110 are formed in such a manner that the electron affinity $E_{a1}$ of the first crystal layer 108 is larger than the electron affinity $E_{a2}$ of the second crystal layer 110.

The epitaxial growth of the semiconductor layer 106 can be performed using metal organic chemical vapor deposition (MOCVD). When MOCVD is used, the In source is, for example, trimethylindium (TMIn), the Ga source is, for example, trimethylgallium (TMGa), the As source is, for example, $AsH_3$ (arsine), and the P source is, for example, $PH_3$ (phosphine). The carrier gas can be hydrogen. The temperature at which the reaction takes place can range from 300° C. to 900° C., preferably from 450° C. to 750° C. The duration of the reaction can be appropriately selected to control the thickness of the epitaxial growth layers.

When the first insulator layer 104 is formed by atomic layer deposition (ALD), the first insulator layer 104 can be formed flat. Therefore, high adhesion can be achieved between the first insulator layer 104 and the semiconductor layer 106, and the semiconductor layer 106 can be less damaged during the step of bonding the first insulator layer 104 and the base wafer 102 to each other. The bonding step is described in detail later.

As shown in FIG. 3, the base wafer 102 is separately provided, the surface of the first insulator layer 104 and the surface of the base wafer 102 are activated using an argon beam 122. Following this, as shown in FIG. 4, the surface of the first insulator layer 104 that has been activated by the argon beam 122 is bonded and attached to the surface of the base wafer 102 that has also been activated by the argon beam 122. The bonding can be performed at a room temperature. The activation does not have to be performed using the argon beam 122 and may alternatively be performed using a beam of a different rare gas. After this, etching is performed using a HCl solution or the like to remove the semiconductor layer-forming wafer 120. In this manner, the semiconductor wafer 100 shown in FIG. 1 can be produced.

Before the bonding, an insulator layer may be formed by ALD on the surface of the base wafer 102, and the insulator layer on the surface of the base wafer 102 may be bonded to the first insulator layer 104. In place of the activation using the argon beam 122 or the like, the surface of the insulator layer on the base wafer 102 and the surface of the first insulator layer 104 may be subjected to hydrophilic treatment before they are bonded together. When the hydrophilic treatment is employed, it is preferable to heat the base wafer 102 and the first insulator layer 104 after bonding them together. Between the formation of the semiconductor layer 106 and the formation of the first insulator layer 104, the surface of the semiconductor layer 106 may be subjected to sulfur-termination treatment.

Figure 5:
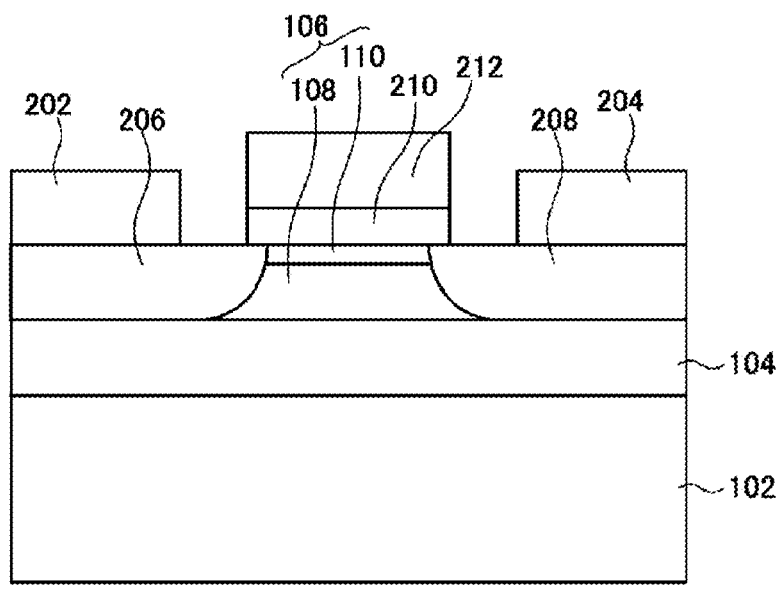
FIG. 5 shows the cross-section of a field-effect transistor 200.

FIG. 5 shows the cross-section of a field-effect transistor 200. The field-effect transistor 200 is formed using the semiconductor wafer 100 shown in FIG. 1. The field-effect transistor 200 includes a source electrode 202 and a drain electrode 204 on the semiconductor wafer 100. The source electrode 202 and the drain electrode 204 are electrically connected to the semiconductor layer 106 of the semiconductor wafer 100. The semiconductor layer 106 includes a source region 206 and a drain region 208. The source region 206 is in contact with the source electrode 202, and the drain region 208 is in contact with the drain electrode 204. The field-effect transistor 200 includes a second insulator layer 210 on a plane of the semiconductor layer 106 that faces away from the plane of the semiconductor layer 106 that is in contact with the first insulator layer 104. The second insulator layer 210 may be provided on a region of the semiconductor layer 106 that is sandwiched between the source region 206 and the drain region 208. The field-effect transistor 200 also includes a gate electrode 212 on the second insulator layer 210. A portion of the second insulator layer 210 serves as a gate insulator. At least one of the boundary of the source region 206 that faces the drain region 208 and the boundary of the drain region 208 that faces the source region 206 is positioned in an under-gate-electrode region, which is a region of the semiconductor layer 106 that is sandwiched between the gate electrode 212 and the base wafer 102. Here, the region that is sandwiched between the gate electrode 212 and the base wafer 102 indicates the region that is positioned between the gate electrode 212 and the base wafer 102 and overlaps both of the gate electrode 212 and the base wafer 102. The boundary of the source region 206 that faces the drain region 208 may indicate the boundary of the source region 206 that is the nearest to the drain region 208. The boundary of the drain region 208 that faces the source region 206 may indicate the boundary of the drain region 208 that is the nearest to the source region 206.

The source region 206 or the drain region 208 contains an alloy of a metal atom and at least one atom selected from the group consisting of the Group III atoms and the Group V atoms forming the semiconductor layer 106. In other words, at least one of the source region 206 and the drain region 208 (preferably, both of the source region 206 and the drain region 208) is a region formed by metallizing the semiconductor layer 106 with the above-mentioned metal atom. The metal atom is, for example, a nickel atom, a cobalt atom, in particular, a nickel atom. The alloy may be an alloy of at least one atom selected from the group consisting of a nickel atom and a cobalt atom, and Group III and Group V atoms. The alloy is preferably an alloy of three elements including a Group III atom, a Group V atom, and a nickel atom.

Since the source region 206 or the drain region 208 contains the above-described alloy, an ohmic contact is established between the source electrode 202 and the source region 206 and between the drain electrode 204 and the drain region 208. This can allow the field-effect transistor 200 to have a high on-current. Since the source-drain resistance is low, the channel resistance does not need to be low and the concentration of the doping impurity atoms is allowed to be low. Consequently, high carrier mobility can be achieved.

When the field-effect transistor 200 is an n-channel field-effect transistor, the source region 206 or the drain region 208 may further contain donor impurity atoms. The donor impurity atoms are, for example, Si, S, Se or Ge atoms. When the field-effect transistor 200 is a p-channel field-effect transistor, the source region 206 or the drain region 208 may further contain acceptor impurity atoms. The acceptor impurity atoms are, for example, Zn, C or Mg atoms.

The relative permittivities, the thicknesses and the electron affinities of the second insulator layer 210 and of the second crystal layer 110 are preferably selected to satisfy the relation represented by Expression 1.

$$(\epsilon_1 \cdot d_0)/(\epsilon_0 \cdot d_1) > (V-\delta)/\delta \quad \text{(Expression 1)}$$

In Expression 1, $d_0$ and $\epsilon_0$ respectively denote the thickness and the relative permittivity of the second insulator layer 210 in the under-gate region sandwiched between the gate electrode 212 and the first crystal layer 108, and $d_1$ and $\epsilon_1$ respectively denote the thickness and the relative permittivity of the second crystal layer 110 in the under-gate region. Also, $\delta$ denotes the difference in electron affinity between the second crystal layer 110 and the first crystal layer 108 and $\delta = E_{a1} - E_{a2}$. Furthermore, V denotes the voltage defined by the expression V=Vg−Vt, Vg denotes the voltage applied to the gate electrode 212 of the field-effect transistor 200, and Vt denotes the threshold voltage. The voltage V can be approximated by the voltage applied to the laminate structure of the second crystal layer 110 and the second insulator layer 210 in the under-gate region when the field-effect transistor 200 is operated by a voltage equal to or higher than the threshold voltage applied to the gate electrode 212.

If the relation represented by Expression 1 is satisfied while the carriers migrate between the source electrode 202 and the drain electrode 204 of the field-effect transistor 200, many channel electrons can be induced at the interface between the first crystal layer 108 and the second crystal layer 110. Therefore, the influence of the interface state existing between the second insulator layer 210 and the second crystal layer 110 on the channel electrons can be reduced. Accordingly, the mobility of the channel electrons can be increased. When the field-effect transistor 200 is used for a CMOS circuit, the power source voltage is preferably no less than 0.4 V and no more than 1.0 V.

The relation represented by Expression 1 can be derived as follows. When the voltage V is applied to the laminate structure of the second crystal layer 110 and the second insulator layer 210 in the under-gate region, the voltage drop ΔV in the second crystal layer 110 can be represented by Expression 2.

$$\Delta V = V \times (d_1/\epsilon_1)/((d_1/\epsilon_1) + d_0/\epsilon_0) \quad \text{(Expression 2)}$$

If ΔV<δ, many channel electrons can be induced between the second insulator layer 210 and the second crystal layer 110. Thus, Expression 3 is obtained.

$$V \times (d_1/\epsilon_1)/((d_1/\epsilon_1) + d_0/\epsilon_0) < \delta \quad \text{(Expression 3)}$$

Expression 3 can be converted into Expression 1. Thus, when the relation represented by Expression 1 is satisfied, high-mobility channel electrons can be induced at the interface between the first crystal layer 108 and the second crystal layer 110.

Figure 6:
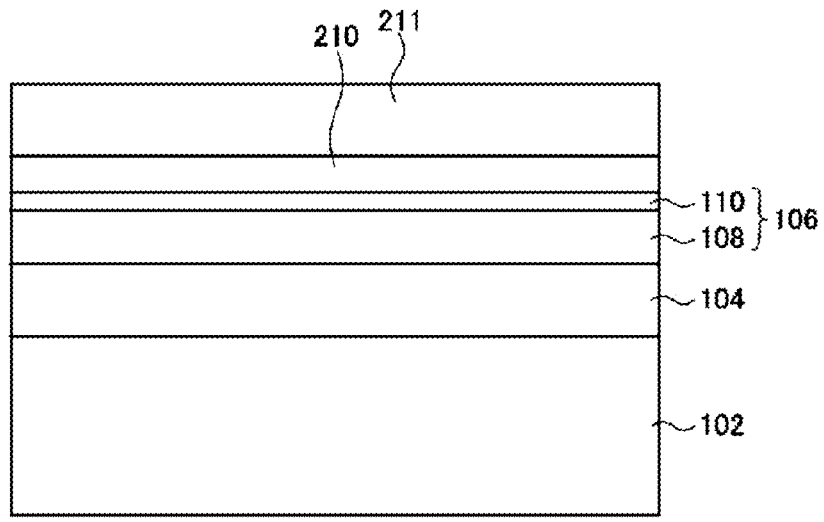
FIG. 6 shows the cross-section observed during the production process of the field-effect transistor 200.
Figure 7:
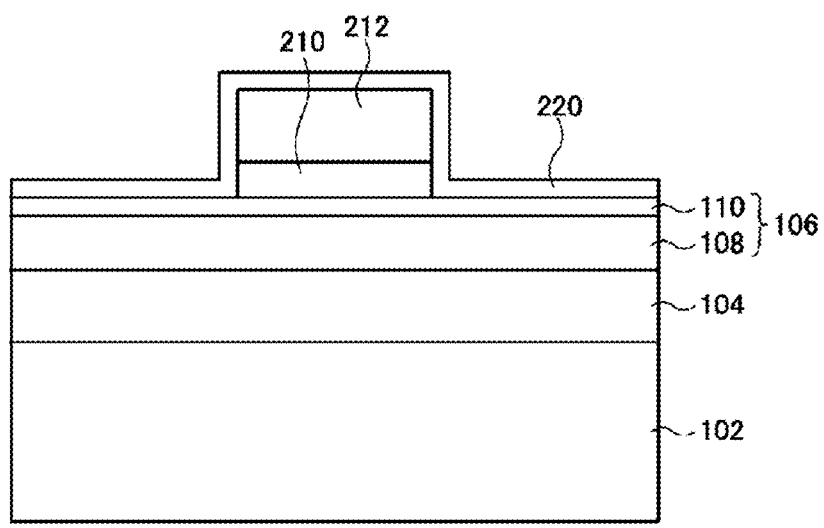
FIG. 7 shows the cross-section observed during the production process of the field-effect transistor 200.
Figure 8:
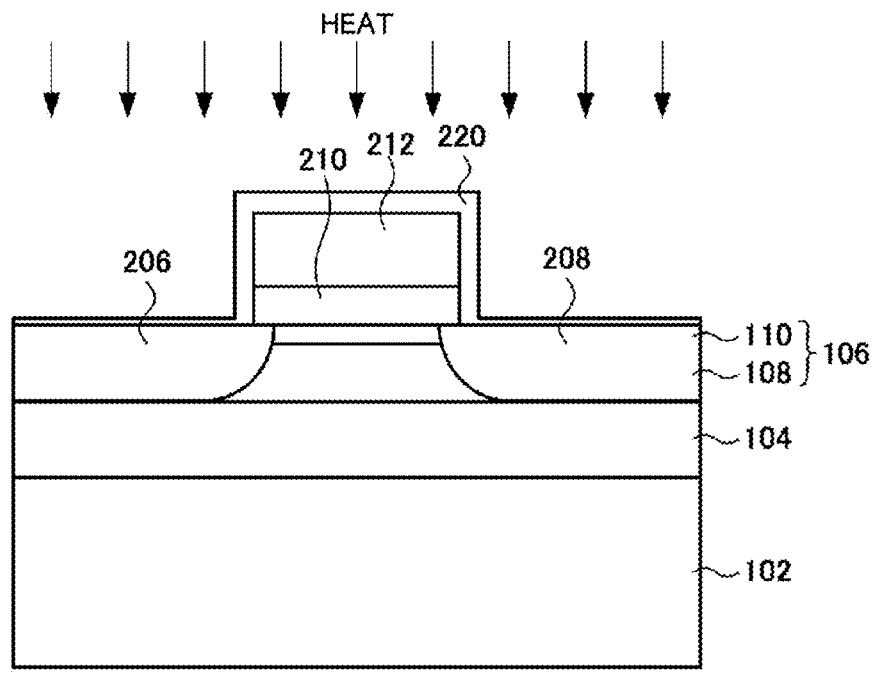
FIG. 8 shows the cross-section observed during the production process of the field-effect transistor 200.

FIGS. 6 to 8 illustrate the cross-section observed during the production process of the field-effect transistor 200. As shown in FIG. 6, the second insulator layer 210 is formed by atomic layer deposition on the semiconductor wafer 100, and a metal layer 211 to be formed into the gate electrode 212 is subsequently formed. As shown in FIG. 7, the metal layer 211 is patterned to form the gate electrode 212, and the gate electrode 212 is used as a mask to pattern the second insulator layer 210. Stated differently, a portion of the second insulator layer 210 that excludes the region in which the gate electrode 212 is formed is etched away, thereby forming an opening that reaches the semiconductor layer 106.

Furthermore, a metal film 220 is formed. Specifically speaking, the metal film 220 is formed so as to be in contact with the semiconductor layer 106 exposed through the opening. The metal film 220 can be formed by, for example, sputtering or evaporation. The metal film 220 is, for example, a nickel film or a cobalt film, preferably a nickel film. As shown in FIG. 8, the metal film 220 is subjected to thermal treatment, thereby forming the source region 206 or the drain region 208 in a portion of the semiconductor layer 106 that is in contact with the metal film 220. After the unreacted portion of the metal film 220 is removed, the source electrode 202 and the drain electrode 204 are formed on the source region 206 and the drain region 208, respectively. Thus, the field-effect transistor 200 shown in FIG. 5 can be fabricated.

When the field-effect transistor 200 is an N-channel field-effect transistor, the metal film 220 may contain a nickel atom and a donor impurity atom (Si or the like). When the field-effect transistor 200 is a P-channel field-effect transistor, the metal film 220 may contain a nickel atom and an acceptor impurity atom (Zn or the like). The thermal treatment of the metal film 220 is preferably performed using rapid thermal annealing (RTA). When RTA is employed, the annealing temperature can be preferably set at 250° C. In the above-described manner, the source region 206 and the drain region 208 can be self-aligned. By controlling one or both of the temperature and the duration of the annealing using RTA, the reaction that proceeds in the lateral direction between the metal atoms constituting the metal film 220 and the semiconductor atoms constituting the semiconductor layer 106 is controlled so as to control the positions of the boundaries of the source region 206 and the drain region 208 that face each other. Stated differently, it can be controlled how much the source region 206 and the drain region 208 go into the under-gate-electrode region. In this way, a planar MOSFET having a channel length of approximately several dozen nanometers (100 nm or less) can be easily produced.

In the case of the above-described semiconductor wafer 100 and the field-effect transistor 200 using the semiconductor wafer 100, the semiconductor layer 106 is formed by epitaxial growth on the semiconductor layer-forming wafer 120 made of InP. Thus, the semiconductor layer 106 can achieve high quality. Since the semiconductor layer 106 is bonded to the base wafer 102 with the amorphous first insulator layer 104 interposed therebetween, the semiconductor layer 106 can maintain the high quality. Thus, the field-effect transistor 200 utilizing the semiconductor layer 106 as the channel layer can achieve high performance. Since the semiconductor layer 106 has an ultrathin body, the leakage currents can be reduced. Furthermore, since the electron affinity $E_{a1}$ of the first crystal layer 108, which is distant from the gate insulator, is larger than the electron affinity $E_{a2}$ of the second crystal layer 110, which is closer to the gate insulator, the carrier electrons in the channel layer are prevented from the scattering at the MIS interface and the carrier mobility in the channel can be thus improved. Additionally, since the source region 206 and the drain region 208 of the field-effect transistor 200 are metallized, the source-drain resistance can be reduced. Since the source-drain resistance is reduced, the doping level of the channel layer can be lowered, which can result in improved carrier mobility.

Figure 9:
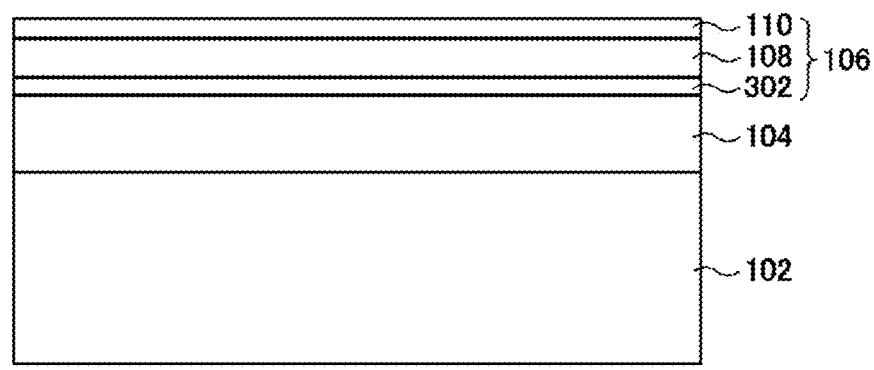
FIG. 9 shows the cross-section of a semiconductor wafer 300.
Figure 10:
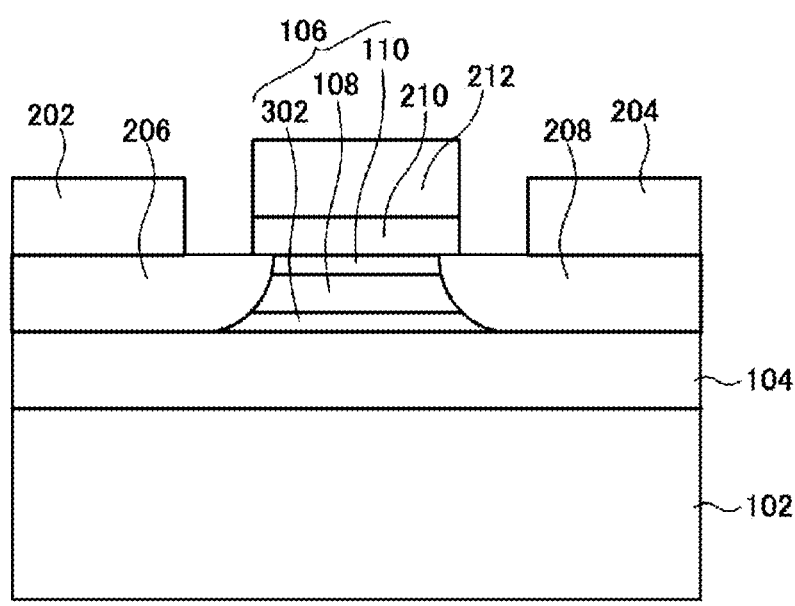
FIG. 10 shows the cross-section of a field-effect transistor 400.

As shown in FIG. 9, the semiconductor layer 106 may further include a third crystal layer 302. FIG. 9 shows the cross-section of a semiconductor wafer 300. The semiconductor wafer 300 may have the same configuration as the semiconductor wafer 100 except that the semiconductor layer 106 additionally includes the third crystal layer 302. Referring to the semiconductor wafer 300, the first crystal layer 108, the second crystal layer 110 and the third crystal layer 302 are arranged in the order of the third crystal layer 302, the first crystal layer 108 and the second crystal layer 110, where the third crystal layer 302 is positioned the closest to the base wafer 102. The third crystal layer 302 is formed in such a manner that the electron affinity $E_{a3}$ of the third crystal layer 302 is smaller than the electron affinity $E_{a1}$ of the first crystal layer 108. FIG. 10 shows the cross-section of a field-effect transistor 400 utilizing the semiconductor wafer 300. The field-effect transistor 400 may have the same configuration as the field-effect transistor 200 except that the semiconductor layer 106 additionally includes the third crystal layer 302.

Referring to the semiconductor wafer 300 and the field-effect transistor 400, the existence of the third crystal layer 302 separates the carrier electrons within the semiconductor layer 106 away from the interface between the semiconductor layer 106 and the first insulator layer 104. This can prevent the scattering of the carrier electrons caused by the interface state at the interface between the first insulator layer 104 and the third crystal layer 302. Consequently, the carrier mobility improves. Since the first crystal layer is sandwiched between the second crystal layer 110 and the third crystal layer 302 that respectively satisfy the relations of $E_a < E_{a1}$, and $E_{a3} < E_{a1}$, the channel electrons within the semiconductor layer 106 are quantized. Therefore, the position within the semiconductor layer 106 at which the number of channel electrons takes a maximum value can be further away from the interface between the semiconductor layer 106 and the first insulator layer 104 and from the interface between the semiconductor layer 106 and the second insulator layer 210. Thus, the carrier mobility is enhanced.

The third crystal layer 302 lattice matches or pseudo-lattice matches the first crystal layer 108. When the first crystal layer 108 is made of InGaAs and the second crystal layer 110 is made of InGaAsP, the third crystal layer 302 can be, for example, made of InGaAsP. When the first crystal layer 108 is made of $In_{x1}Ga_{1-x1}As$ ($0<x1\leq 1$) and the second crystal layer 110 is made of $In_{x2}Ga_{1-x2}As$ ($0\leq x2\leq 1$, $x1>x2$), the third crystal layer 302 can be, for example, made of $In_{x3}Ga_{1-x3}As$ ($0\leq x3<1$, $x1>x3$). The first crystal layer 108 is, for example, made of $In_{x1}Ga_{1-x1}As$ ($0.53\leq x1\leq 1$). In this case, the second crystal layer 110 is, for example, made of $In_{x2}Ga_{1-x2}As$ ($0\leq x2<0.53$) and the third crystal layer 302 is, for example, made of $In_{x3}Ga_{1-x3}As$ ($0\leq x3<0.53$). Here, x2 may be equal to x3. When the first crystal layer 108 is made of $In_{0.7}Ga_{0.3}As$ and the second crystal layer 110 is made of $In_{0.3}Ga_{0.7}As$, the third crystal layer 302 can be, for example, made of $In_{0.3}Ga_{0.7}As$. When the first crystal layer 108 is made of InAs and the second crystal layer 110 is $In_{0.3}Ga_{0.7}As$, the third crystal layer 302 can be, for example, made of $In_{0.3}Ga_{0.7}As$.

The thickness of the third crystal layer 302 may preferably fall within the range of 20 nm or less, in particular, within the range of 2 nm to 5 nm. During the production process of the semiconductor layer 106, the third crystal layer 302 can be formed by epitaxial growth after the first crystal layer 108 is formed.

Figure 11:
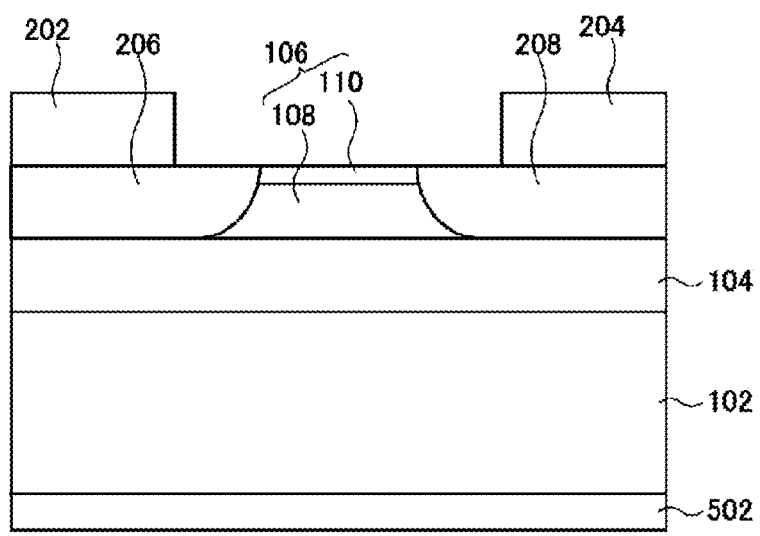
FIG. 11 shows the cross-section of a field-effect transistor 500.

In the above, a front-gate field-effect transistor, which has the gate electrode 212 on the side of the front surface of the semiconductor wafer, is described as an example. A field-effect transistor may alternatively have a back gate electrode 502 as shown in FIG. 11. Specifically speaking, a field-effect transistor 500 shown in FIG. 11 is different from the field-effect transistor 200 shown in FIG. 5 or the field-effect transistor 400 shown in FIG. 10 in terms that the second insulator layer 210 and the gate electrode 212 are not provided and that the back gate electrode 502 is provided on the plane of the base wafer 102 that faces away from the first insulator layer 104. The field-effect transistor 500 may include the source electrode 202, the drain electrode 204, the source region 206, the drain region 208, the semiconductor layer 106, the first insulator layer 104, and the base wafer 102, in the same manner as the field-effect transistor 200 shown in FIG. 5 or the field-effect transistor 400 shown in FIG. 10. In the field-effect transistor 500, the first insulator layer 104 partially serves as a gate insulator.

Figure 12:
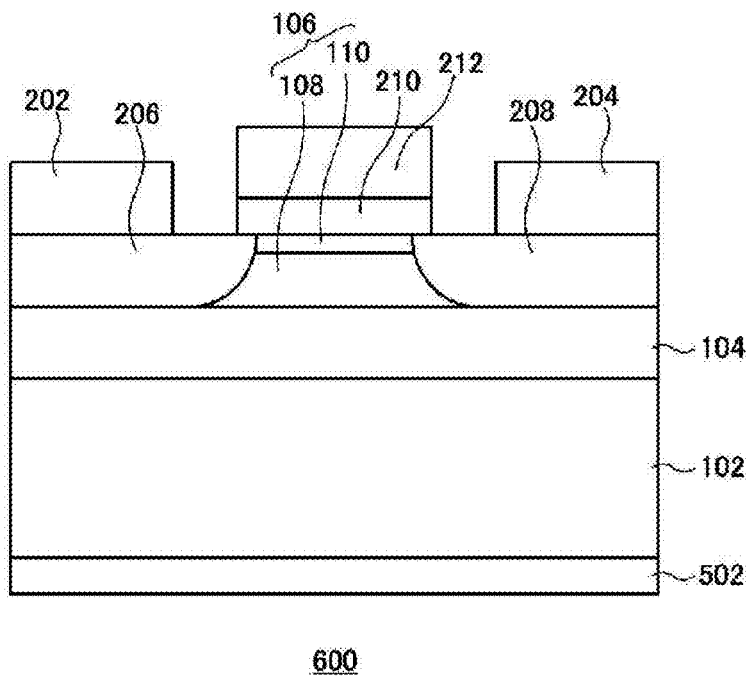
FIG. 12 shows the cross-section of a field-effect transistor 600.

As shown in FIG. 12, a double-gate field-effect transistor may be provided that is a combination of a front gate structure and a back gate structure. Specifically speaking, a field-effect transistor 600 shown in FIG. 12 includes the back gate electrode 502 arranged on the base wafer 102, and the gate electrode 212 that is provided on the plane of the semiconductor layer 106 that faces away from its plane in contact with the first insulator layer 104 with the second insulator layer 210 being interposed therebetween. The first insulator layer 104 and the second insulator layer 210 partially serve as a gate insulator. The field-effect transistor 600 may include the source electrode 202, the drain electrode 204, the source region 206, the drain region 208, the semiconductor layer 106, the first insulator layer 104, and the base wafer 102, in the same manner as the field-effect transistor 200 shown in FIG. 5 or the field-effect transistor 400 shown in FIG. 10.

First Working Example

An InGaAs layer was epitaxially grown by metal organic vapor phase epitaxy (MOVPE) on an InP wafer of the plane orientation (001), and an $Al_2O_3$ layer was formed by ALD on the InGaAs layer. Another $Al_2O_3$ layer was formed by ALD on a separate silicon wafer. The $Al_2O_3$ layers formed on the InP wafer and the silicon wafer were subjected to hydrophilic treatment, the InP wafer was bonded to the silicon wafer, and InP was selectively removed using a HCl solution. In this way, a semiconductor wafer constituted by the InGaAs layer, the $Al_2O_3$ layer (BOX layer) and the silicon wafer was produced.

The surface of the InGaAs layer of the thus-produced semiconductor wafer was cleaned using acetone, $NH_4OH$, $(NH_4)_2S$ and subjected to sulfur-termination treatment. After this, an $Al_2O_3$ layer having the thickness of 10 nm was formed using ALD on the InGaAs layer. The sulfur-termination treatment may not use acetone and $NH_4OH$ and may only use $(NH_4)_2S$. A gate electrode made of tantalum was formed by sputtering and subjected to post-metallization annealing, after which a nickel film having the thickness of 20 nm was formed. The nickel film was subjected to RTA at the temperature of 250° C., to form a source and a drain (S/D) made of Ni—InGaAs alloy. In this way, a field-effect transistor was produced.

Five sample field-effect transistors (1) to (5) were produced that differ from each other in terms of the InGaAs layer as follows.

(1) $In_{0.7}Ga_{0.3}As$ having the thickness of 10 nm (single layer)

(2) $In_{0.7}Ga_{0.3}As$ having the thickness of 5 nm (single layer)

(3) A laminate constituted by $In_{0.3}Ga_{0.7}As/In_{0.7}Ga_{0.3}As/In_{0.3}Ga_{0.7}As$ having the thicknesses of 2/1/3 nm (4) A laminate constituted by $In_{0.3}Ga_{0.7}As/In_{0.7}Ga_{0.3}As/In_{0.3}Ga_{0.7}As$ having the thicknesses of 2/3/3 nm (5) A laminate constituted by $In_{0.3}Ga_{0.7}As/In_{0.7}Ga_{0.3}As/In_{0.3}Ga_{0.7}As$ having the thicknesses of 2/5/3 nm In the following description made with reference to FIGS. 13 to 20, the samples (1) and (2) may be referred to using the terms such as "without buffer" or "single channel," and the samples (3) to (5) may be referred to using the term "with buffer." The thickness of the InGaAs layer may be referred to as "the thickness of the body" and the thickness of the $In_{0.7}Ga_{0.3}As$ layer may be referred to as "the thickness of the channel" in relation to the samples (3) to (5).

Figure 13:
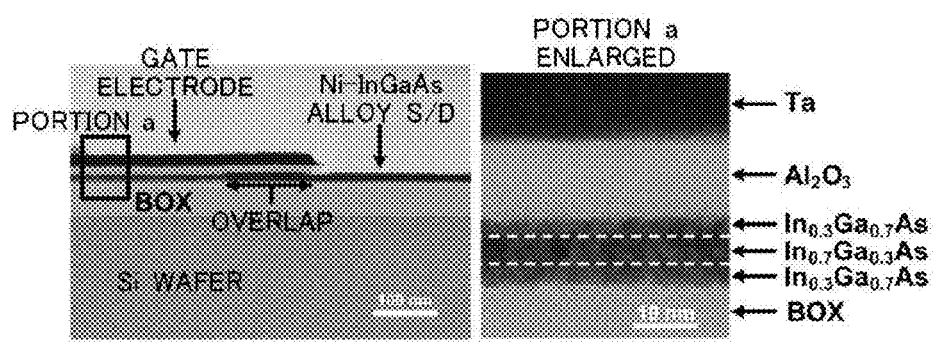
FIG. 13 shows a TEM photograph showing the cross section of a field-effect transistor of a first working example.

FIG. 13 is a TEM photograph showing the cross-section of the sample (5). FIG. 13 shows that the respective layers were formed appropriately. It was confirmed that the Ni—InGaAs alloy under the gate overlapped the gate to an appropriate extent and that the source and the drain of Ni—InGaAs alloy were formed in self-alignment.

Figure 14:
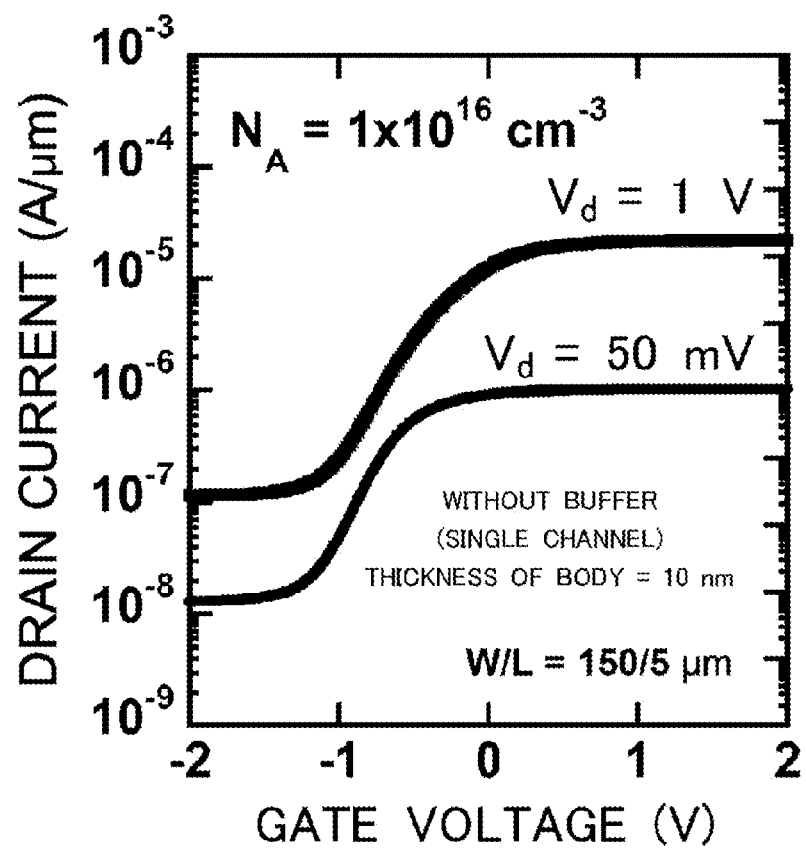
FIG. 14 shows the Id-Vg characteristics of the field-effect transistor of the first working example.
Figure 15:
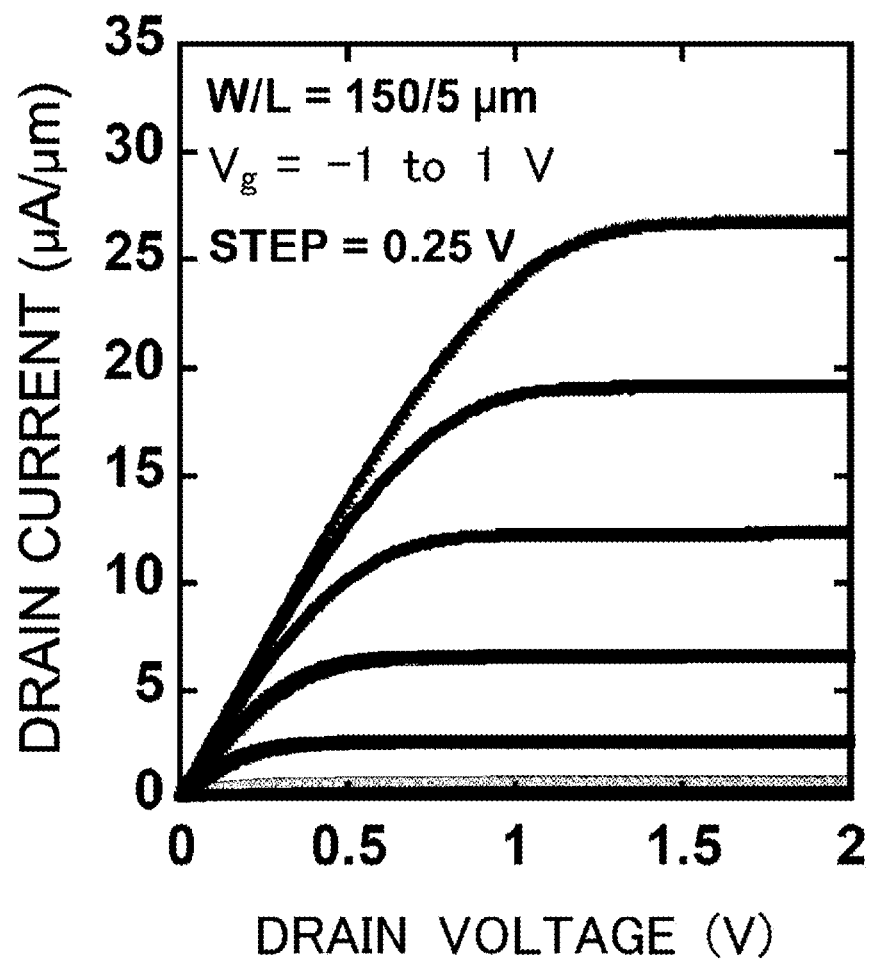
FIG. 15 shows the Id-Vg characteristics of the field-effect transistor of the first working example.
Figure 16:
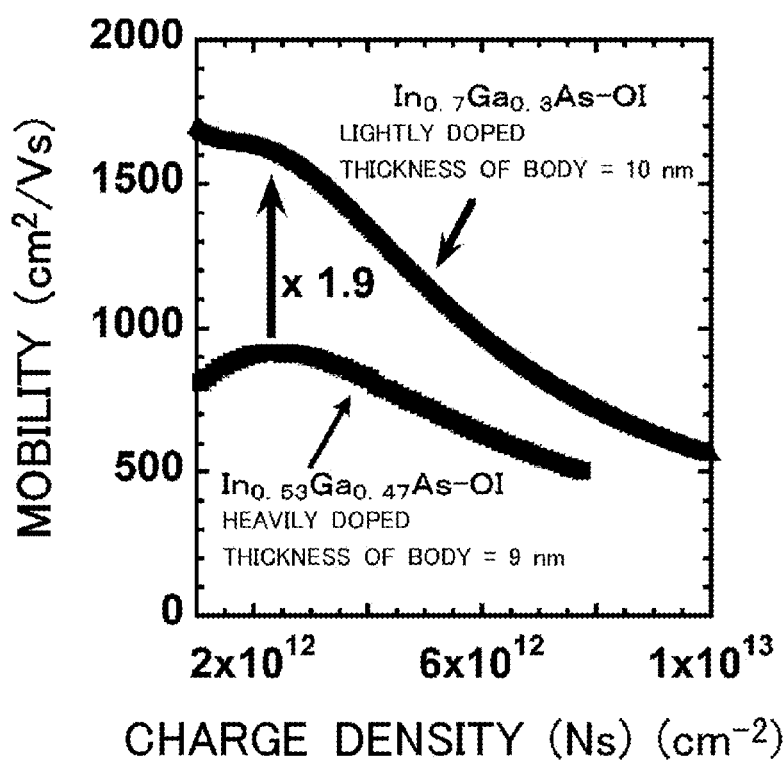
FIG. 16 shows the mobility of the field-effect transistor of the first working example.

FIG. 14 shows the Id-Vg characteristics of the sample (1). FIG. 15 shows the Id-Vd characteristics of the sample (1). FIG. 16 shows the relation between the mobility and the charge density Ns for the sample (1). FIG. 16 also shows, for the comparison purpose, the data of a sample that has a heavily doped InGaAs channel (having the thickness of 9 nm) instead of using a Ni—InGaAs alloy for the source and the drain. With reference to FIGS. 14 to 16, the sample (1) exhibited a high on-current irrespective of a low channel doping concentration of $1\times10^{16}$ atoms/cm$^3$. This is the result of the fact that the source and the drain were made of the Ni—InGaAs alloy. As seen from FIG. 15, the sample (1) exhibited excellent Id-Vd characteristics. As seen from FIG. 16, the mobility of the sample (1) was approximately 1.9 times as high as the mobility of the comparative example that did not constitute the source and the drain with a Ni—InGaAs alloy. It was therefore confirmed that the source and the drain achieved an improved mobility when made of a Ni—InGaAs alloy.

Figure 17:
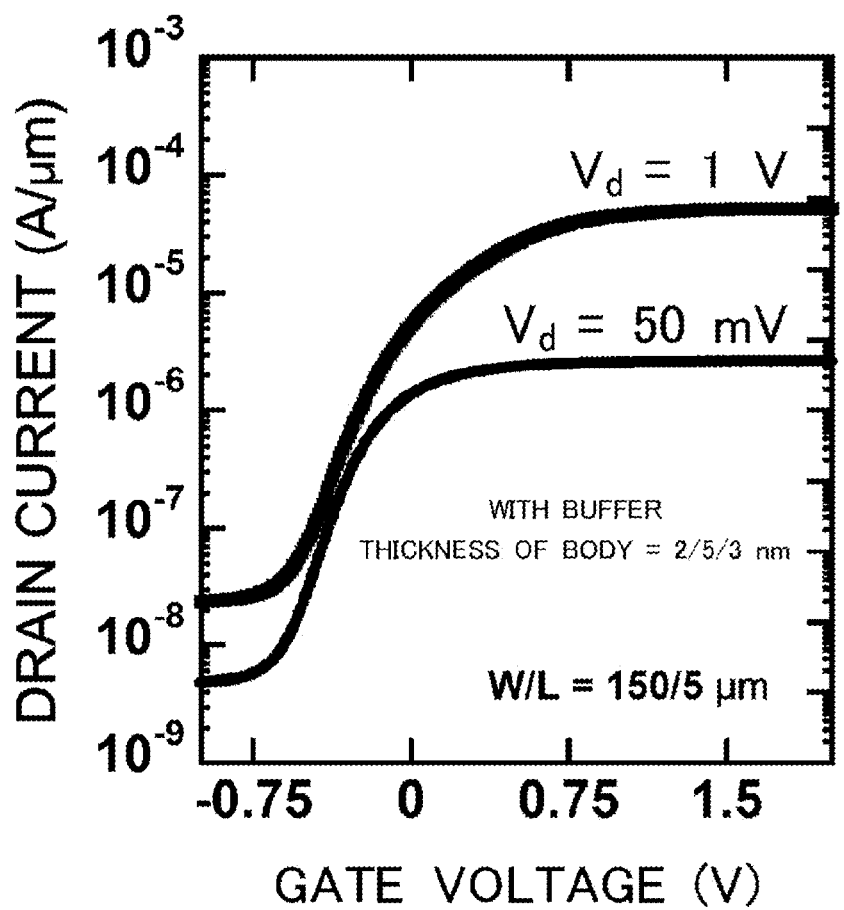
FIG. 17 shows the Id-Vg characteristics of the field-effect transistor of the first working example.
Figure 18:
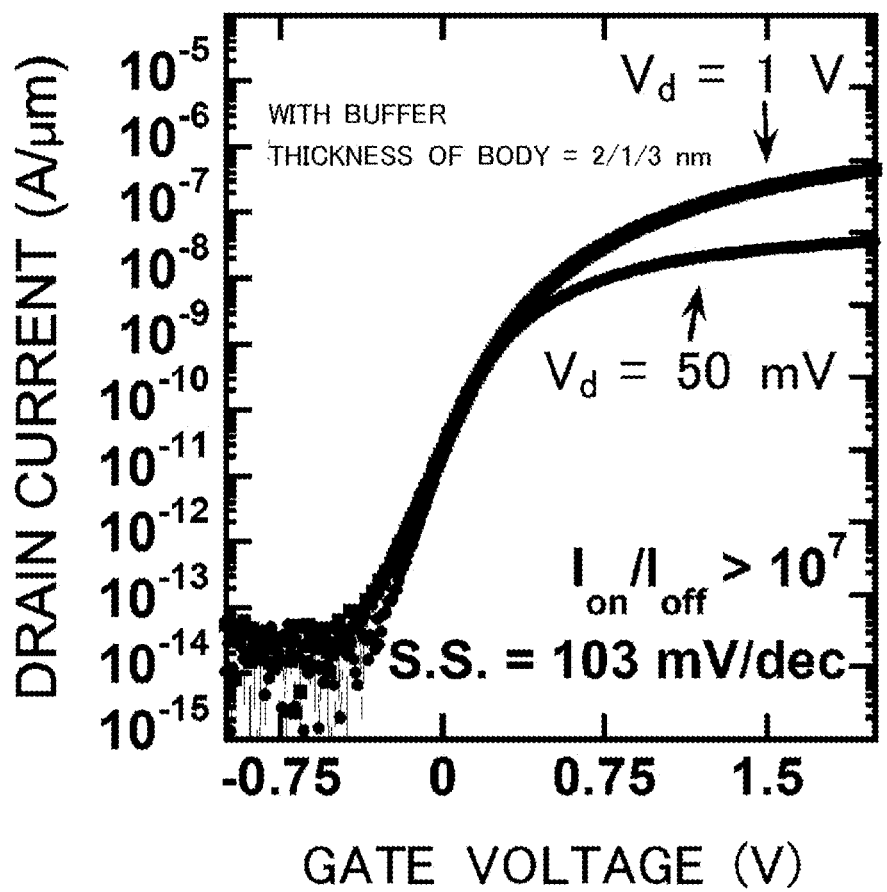
FIG. 18 shows the Id-Vg characteristics of the field-effect transistor of the first working example.
Figure 19:
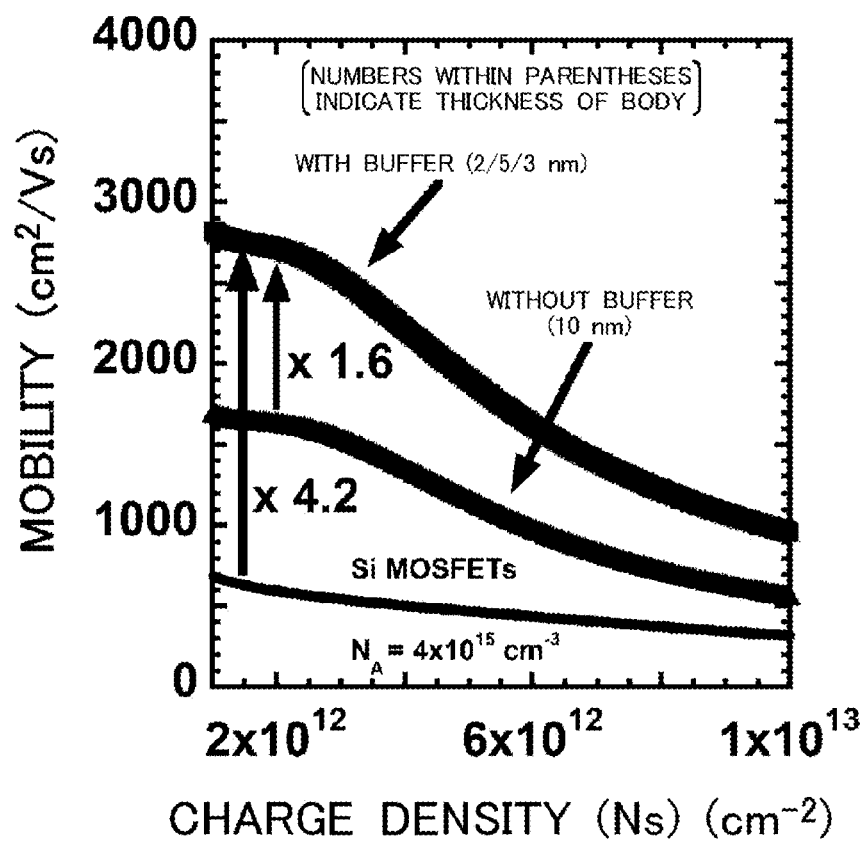
FIG. 19 shows the mobility of the field-effect transistor of the first working example.

FIG. 17 shows the Id-Vg characteristics of the sample (5). The sample (5) exhibited a three-digit on/off ratio and a low subthreshold swing value of 183 mV/dec. FIG. 18 shows the Id-Vg characteristics of the sample (3). The sample (3) exhibited a seven-digit on/off ratio and an extremely excellent subthreshold swing value of 103 mV/dec. FIG. 19 shows the relation between the mobility and the charge density Ns for the sample (5). FIG. 19 also shows, for the comparison purpose, the same parameters for the sample (1) (WITHOUT BUFFER) and a Si MOSFET. The mobility of the sample (5) was 4.2 times and 1.6 times higher than the mobility of the Si MOSFET and the mobility of the sample (1). Thus, it has been confirmed that utilizing the laminated channel of $In_{0.3}Ga_{0.7}As/In_{0.7}Ga_{0.3}As/In_{0.3}Ga_{0.7}As$ effectively enhanced the mobility.

Figure 20:
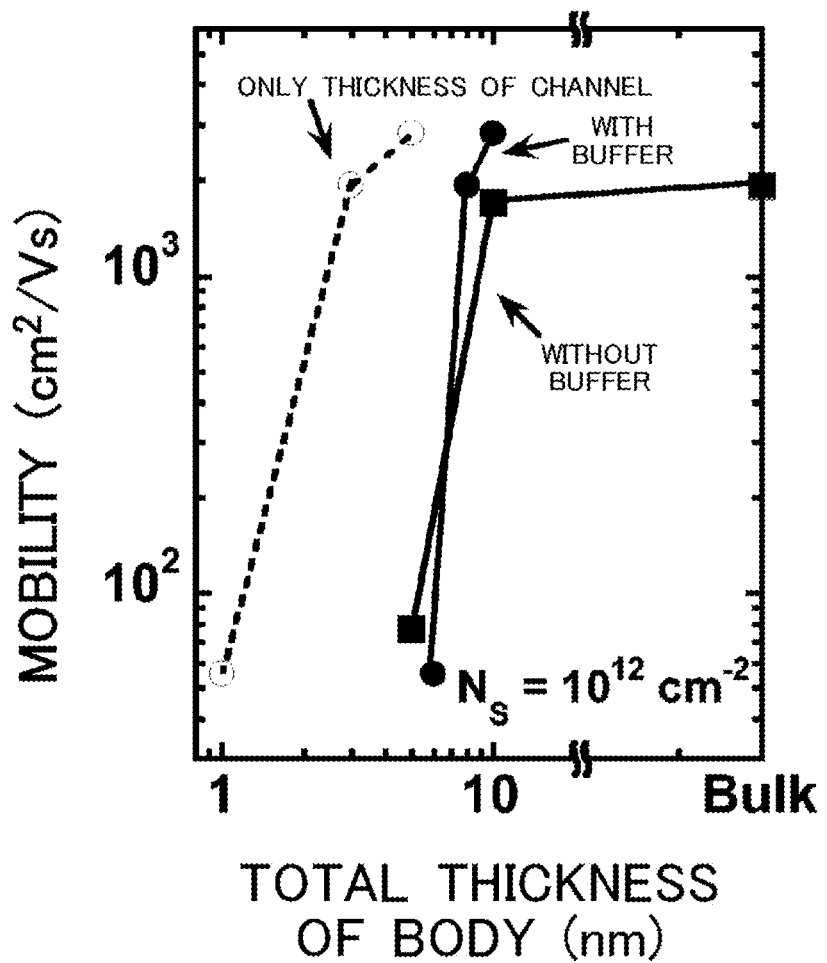
FIG. 20 shows how the mobility of the field-effect transistor of the first working example is dependent on the channel layer thickness.

FIG. 20 shows how the mobility is dependent on the thickness of the channel material for the samples (1) to (5). As is seen from FIG. 20, while the mobility rapidly decreases when the thickness of the channel material (TOTAL THICKNESS OF BODY) falls below approximately 10 nm, it was confirmed that the laminated channel structure of $In_{0.3}Ga_{0.7}As/In_{0.7}Ga_{0.3}As/In_{0.3}Ga_{0.7}As$ (WITH BUFFER) maintained high mobility even if the channel layer was thinner, as compared with the single-layer structure (WITHOUT BUFFER). FIG. 20 also shows that the laminated channel structure achieved higher mobility than a bulk structure.

Second Working Example

Similarly to the first working example, an InGaAs layer was epitaxially grown by MOVPE on an InP wafer of the plane orientation (001), and an $Al_2O_3$ layer was formed by ALD on the InGaAs layer. Another $Al_2O_3$ layer was formed by ALD on a separate silicon wafer. The $Al_2O_3$ layers formed on the InP wafer and the silicon wafer were subjected to hydrophilic treatment, the InP wafer was bonded to the silicon wafer, and InP was then selectively removed using a HCl solution. In this way, a semiconductor wafer constituted by the InGaAs layer, the $Al_2O_3$ layer (BOX layer) and the silicon wafer was produced.

The surface of the InGaAs layer of the thus-produced semiconductor wafer was cleaned using acetone, $NH_4OH$, $(NH_4)_2S$ and subjected to sulfur-termination treatment. After this, an $Al_2O_3$ layer having the thickness of 10 nm was formed using ALD on the InGaAs layer. A gate electrode made of tantalum was formed by sputtering and subjected to post-metallization annealing, after which a nickel film having the thickness of 20 nm was formed. The nickel film was subjected to RTA at the temperature of 250° C., to form a source and a drain (S/D) using a Ni—InGaAs alloy. In this way, a field-effect transistor was produced. The gate length L of the field-effect transistor was 5 μm and the gate width W was 100 μm.

Four sample field-effect transistors (6) to (9) were produced that differ from each other in terms of the InGaAs layer as follows.

(6) A laminate constituted by $In_{0.3}Ga_{0.7}As/InAs/In_{0.3}Ga_{0.7}As$ having the thicknesses of 3/3/3 nm (7) A laminate constituted by $In_{0.3}Ga_{0.7}As/In_{0.7}Ga_{0.3}As/In_{0.3}Ga_{0.7}As$ having the thicknesses of 3/5/3 nm (8) $In_{0.7}Ga_{0.3}As$ having the thickness of 10 nm (single layer)

(9) $In_{0.53}Ga_{0.47}As$ having the thickness of 20 nm (single layer)

In the following description made with reference to FIGS. 21 to 23, the samples (8) and (9) may be referred to using the terms such as "without buffer" or "single channel," and the samples (6) and (7) may be referred to using the term "with buffer." The thickness of the InGaAs layer may be referred to as "the thickness of the body," and the thickness of the $In_{0.7}Ga_{0.3}As$ layer or the $In_{0.53}Ga_{0.47}As$ layer may be referred to as "the thickness of the channel" in relation to the samples (8) and (9).

Figure 21:
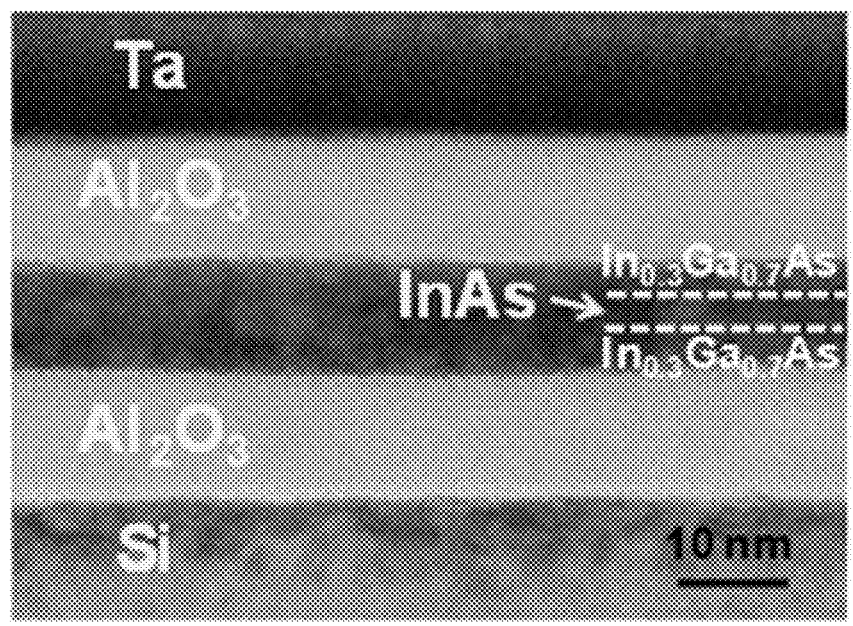
FIG. 21 shows a TEM photograph showing the cross-section of a field-effect transistor of a second working example.
Figure 22:
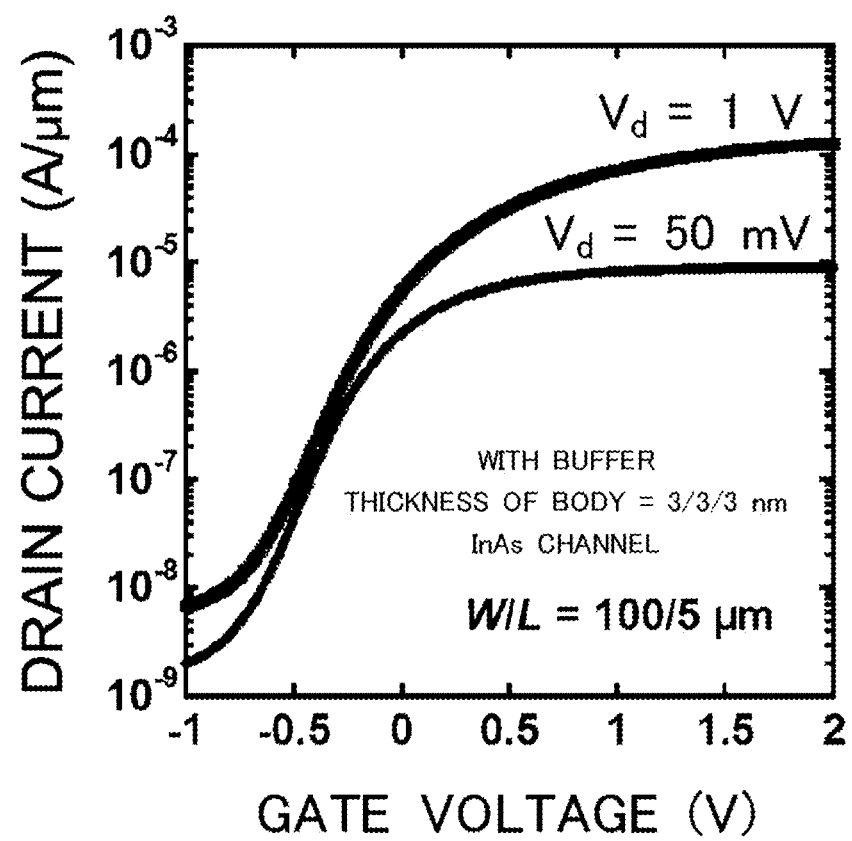
FIG. 22 shows the Id-Vg characteristics of the field-effect transistor of the second working example.

FIG. 21 is a TEM photograph showing the cross-section of the sample (6). Even when the channel layer was made of InAs, the respective layers were appropriately formed as in the first working example, and the Ni—InGaAs alloy under the gate overlapped the gate to an appropriate extent. The source and the drain made of the Ni—InGaAs alloy were self-aligned. FIG. 22 shows the Id-Vg characteristics of the sample (6). Even when the channel layer was made of InAs, the sample (6) operated appropriately as a transistor as in the first working example.

Figure 23:
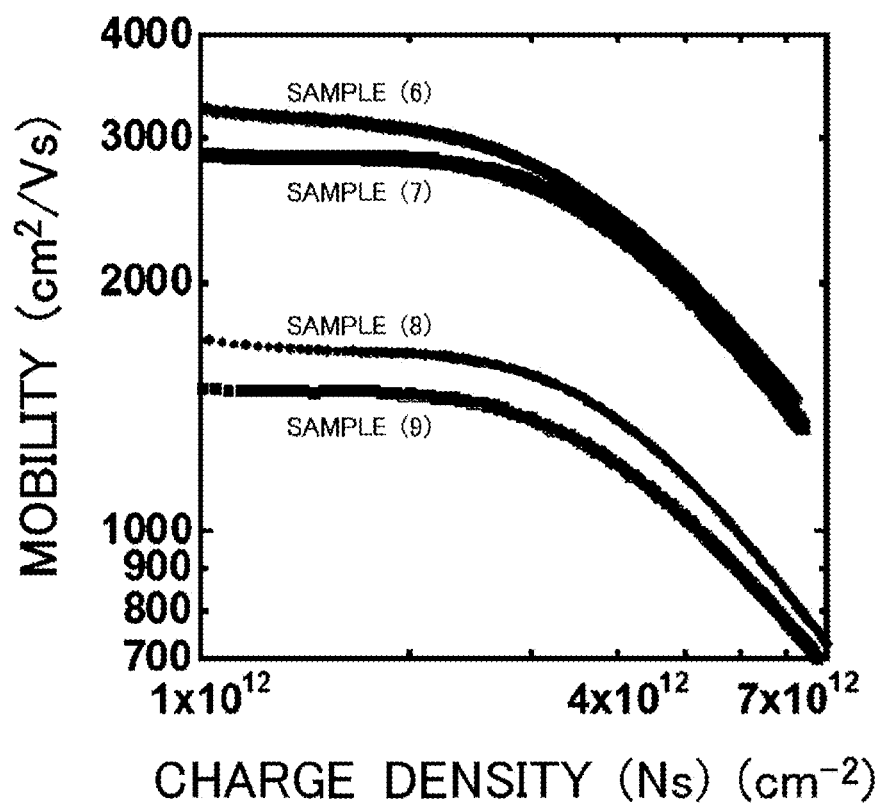
FIG. 23 shows the mobility of the field-effect transistor of the second working example.

FIG. 23 shows the relation between the mobility and the charge density Ns at a room temperature for the samples (6) to (9). The mobility of the samples (6) and (7) having a laminated channel was higher than the mobility of the samples (8) and (9) having a single-layer channel. The mobility of the sample (6), in which a layer equivalent to the first crystal layer 108 has an indium proportion of 1, was higher than the mobility of the sample (7), in which a layer equivalent to the first crystal layer 108 has an indium proportion of 0.7. Thus, as the indium proportion increases, the mobility can accordingly increase. The maximum mobility of the sample (6) reaches 3180 $cm^2/Vs$. This was the first time that an ultrathin-body (UTB) InAs-composite OI channel having the thickness of 10 nm or less achieved a mobility of 3180 $cm^2/Vs$.

Third Working Example

Similarly to the first working example, an InGaAs layer was epitaxially grown by MOVPE on an InP wafer of the plane orientation (001), and an $Al_2O_3$ layer was formed by ALD on the InGaAs layer. Another $Al_2O_3$ layer was formed by ALD on a separate silicon wafer. The $Al_2O_3$ layers formed on the InP wafer and the silicon wafer were subjected to hydrophilic treatment, the InP wafer was bonded to the silicon wafer, and InP was then selectively removed using a HCl solution. In this way, a semiconductor wafer constituted by the InGaAs layer, the $Al_2O_3$ layer (BOX layer) and the silicon wafer was produced.

The surface of the InGaAs layer of the thus-produced semiconductor wafer was cleaned using acetone, $NH_4OH$, $(NH_4)_2S$ and subjected to sulfur-termination treatment. After this, an $Al_2O_3$ layer having the thickness of 10 nm was formed using ALD on the InGaAs layer. A gate electrode made of tantalum was formed by sputtering and electron beam lithography. The width of the gate electrode was set to approximately 200 nm, and microfabrication was implemented. After post-metallization annealing was performed, a 20 nm thick nickel film was formed. The nickel film was subjected to RTA at the temperature of 250° C., to form a source and a drain (S/D) made of Ni—InGaAs alloy. The source and the drain were laterally (horizontally) extended through thermal reaction between the InGaAs layer and the nickel film, so that the boundaries of the source and the drain regions that oppose each other were formed under the gate electrode. In this way, a field-effect transistor was produced. The gate length L of the field-effect transistor was approximately 55 nm.

Two sample field-effect transistors (10) and (11) were produced that differ from each other in terms of the InGaAs layer as follows.

(10) A laminate constituted by $In_{0.3}Ga_{0.7}As/InAs/In_{0.3}Ga_{0.7}As$ having the thicknesses of 3/3/3 nm

(11) $In_{0.53}Ga_{0.47}As$ having the thickness of 10 nm (single layer)

In the following description made with reference to FIGS. 24 to 37, the sample (11) may be referred to using the terms such as "without buffer" or "single channel," and the sample (10) may be referred to using the term "with buffer." The thickness of the InGaAs layer may be referred to as "the thickness of the body" and the thickness of the $In_{0.53}Ga_{0.47}As$ layer may be referred to as "the thickness of the channel" in relation to the sample (11).

Figure 24:
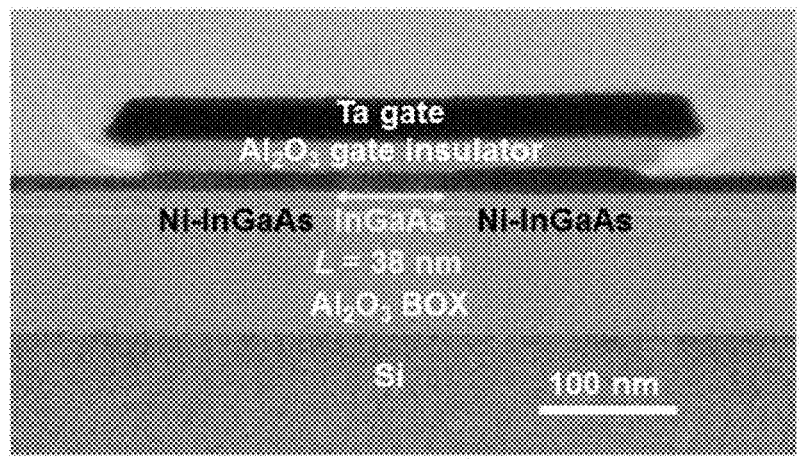
FIG. 24 shows a TEM photograph showing the cross-section of a field-effect transistor of a third working example.
Figure 25:
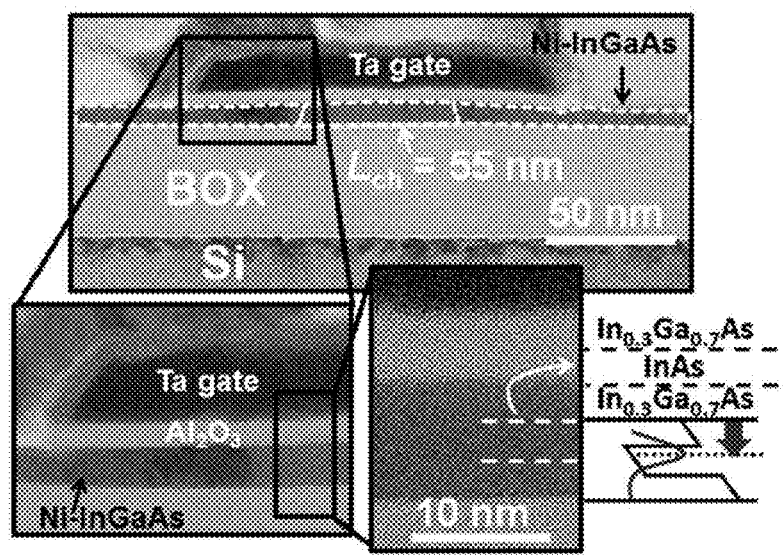
FIG. 25 shows a TEM photograph showing the cross-section of the field-effect transistor of the third working example.

FIGS. 24 and 25 are each a TEM photograph showing the cross-section of the sample (10). As in the first working example, the respective layers were appropriately formed. FIG. 25 shows that the overlapping portion of the Ni—InGaAs alloy was positioned in the InGaAs layer under the gate. The length of the overlapping portion from the edge of the gate was approximately several dozen nanometers. If the width of the gate electrode is several hundred nanometers and the length of the overlapping portion is controlled by the temperature or duration of the thermal treatment, the gate length of the transistor (the distance between the source and the drain) can be controlled precisely and easily. In addition, it was confirmed that the source and the drain made of the Ni—InGaAs alloy were formed in self-alignment. In the above-described manner, a planar MOSFET having a channel length of 100 nm or less can be easily produced.

Figure 26:
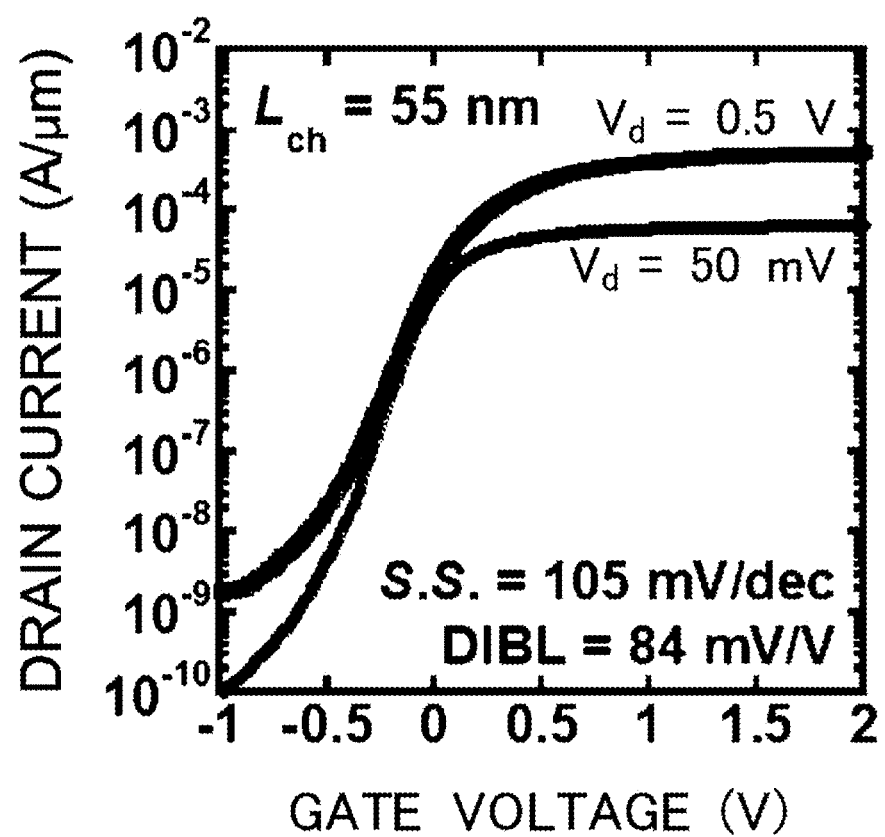
FIG. 26 shows the Id-Vg characteristics of the field-effect transistor of the third working example.
Figure 27:
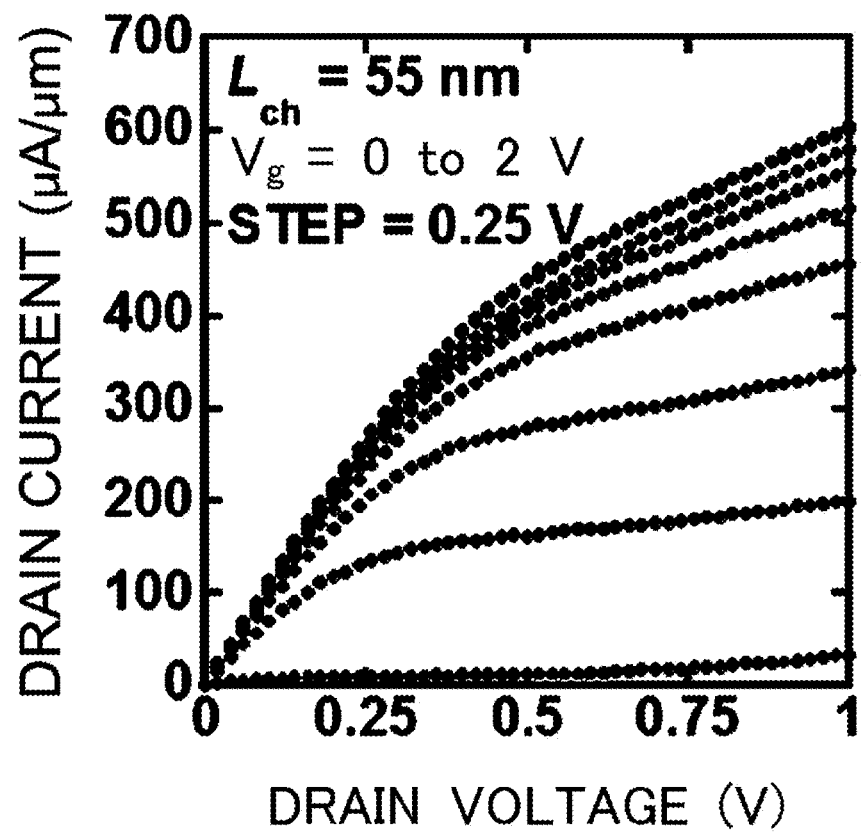
FIG. 27 shows the Id-Vd characteristics of the field-effect transistor of the third working example.

FIG. 26 shows the Id-Vg characteristics of the sample (10). FIG. 27 shows the Id-Vg characteristics of the sample (10). It was proved that a MOSFET having an InAs laminated channel on an insulator layer and a fine gate length of 55 nm had excellent transistor characteristics.

Figure 28:
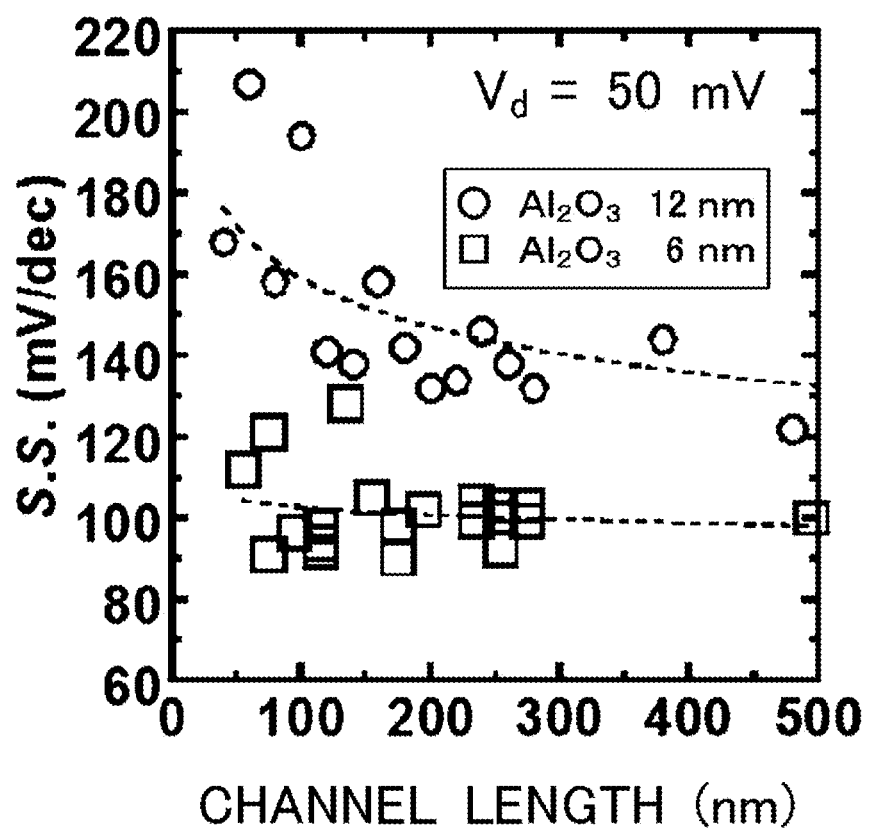
FIG. 28 shows how the subthreshold swing value (the S.S. value) of a field-effect transistor is dependent on the channel length.
Figure 29:
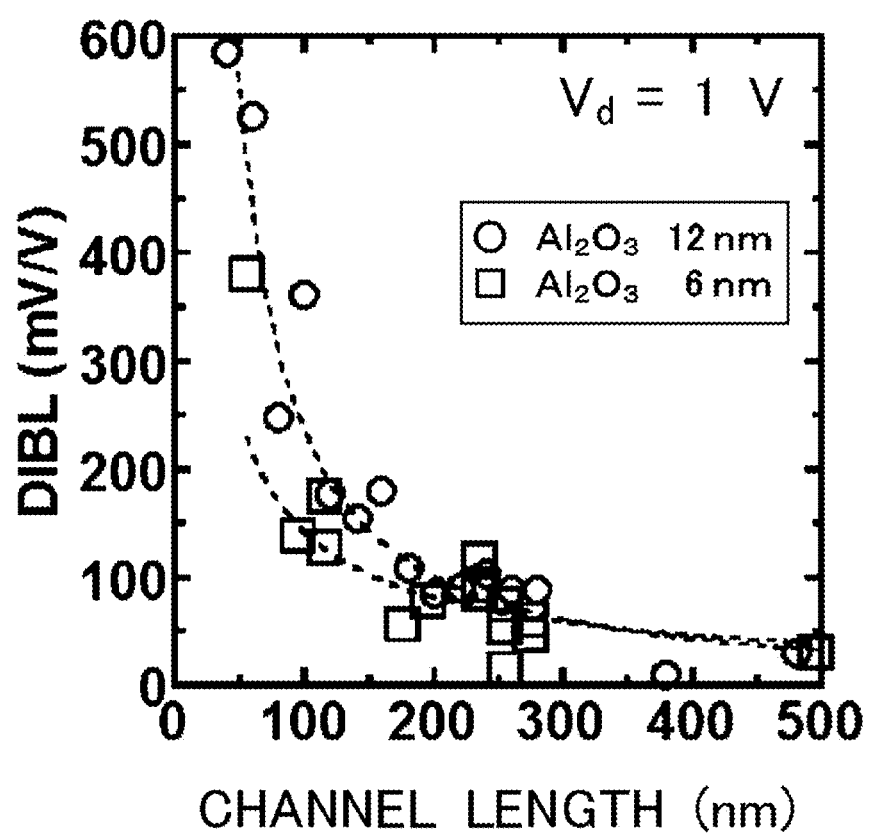
FIG. 29 shows how the drain induced barrier lowering (DIBL) value of a field-effect transistor is dependent on the channel length.
Figure 30:
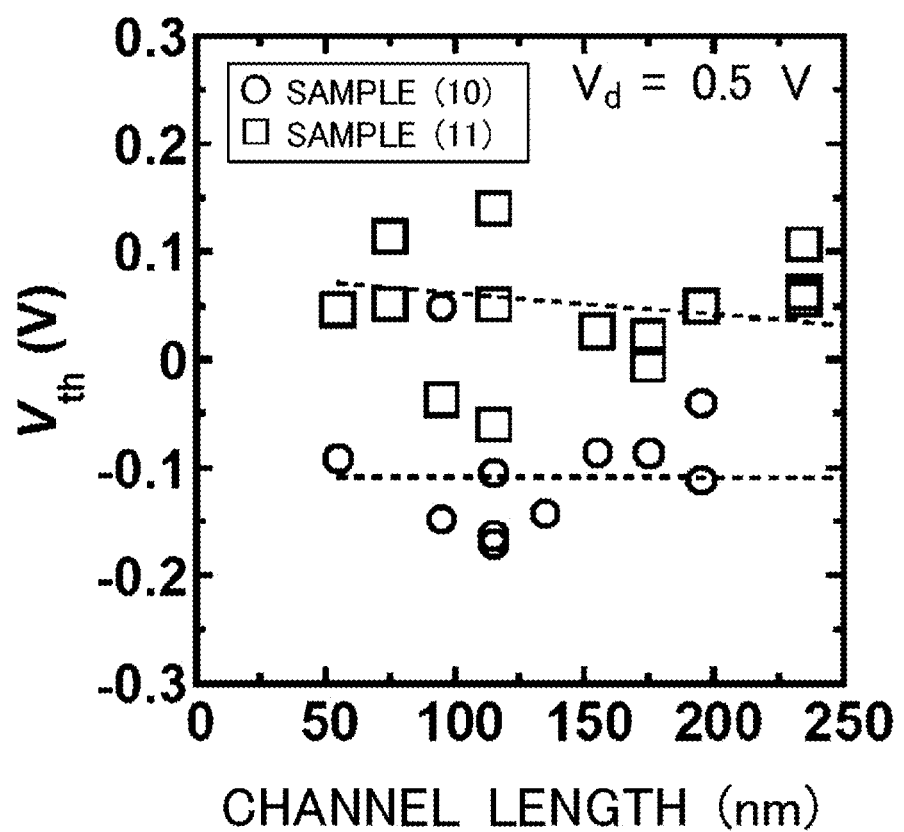
FIG. 30 shows how the threshold value (Vth) of the field-effect transistor of the third working example is dependent on the channel length.

FIG. 28 shows how the S.S. value (the subthreshold swing value) of the sample (11) is dependent on the channel length, and FIG. 29 shows how the DIBL (drain induced barrier lowering) value of the sample (11) is dependent on the channel length. In FIGS. 28 and 29, the dependency observed when the thickness of the $Al_2O_3$ layer serving as a gate insulator was set at 6 nm and 12 nm were shown for the comparison purpose. The S.S. value is smaller when the $Al_2O_3$ layer has the thickness of 6 nm than when the $Al_2O_3$ layer has the thickness of 12 nm. This is probably because the channel is advantageously positioned closer to the gate electrode. The DIBL value is smaller when the $Al_2O_3$ layer has the thickness of 6 nm than when the $Al_2O_3$ layer has the thickness of 12 nm. This proves that the transistor performance may be improved by reducing (scaling) the effective oxide thickness (EOT).

Figure 33:
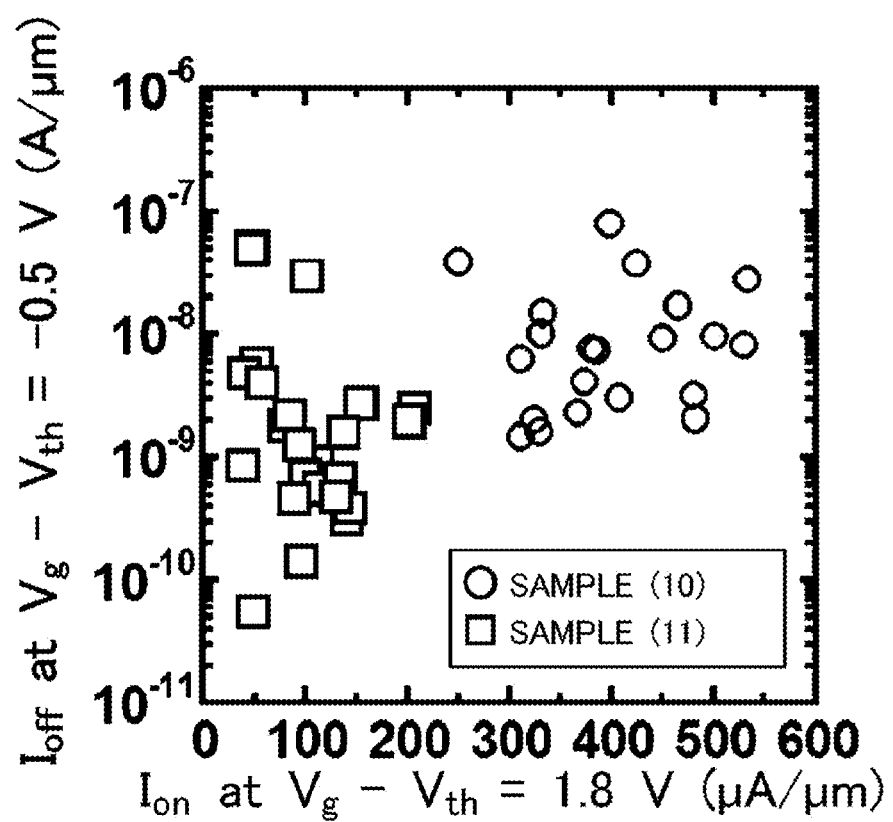
FIG. 33 shows the on-current characteristics and the off-current characteristics of the field-effect transistor of the third working example.
Figure 34:
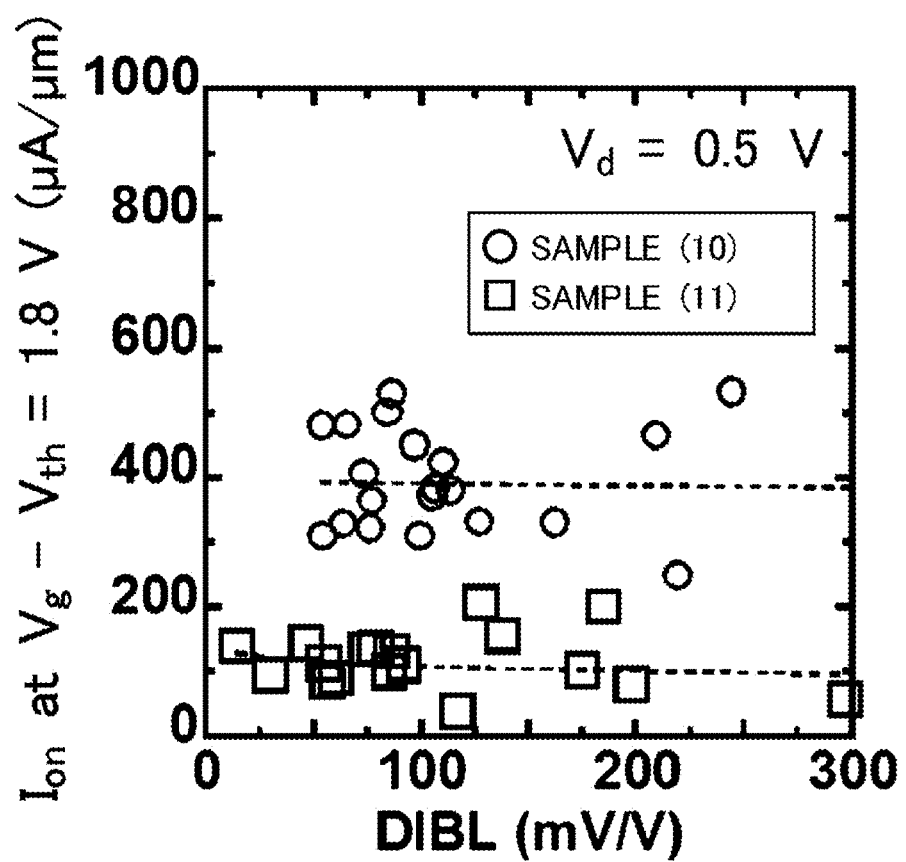
FIG. 34 shows how the on-current of the field-effect transistor of the third working example is dependent on the DIBL.
Figure 35:
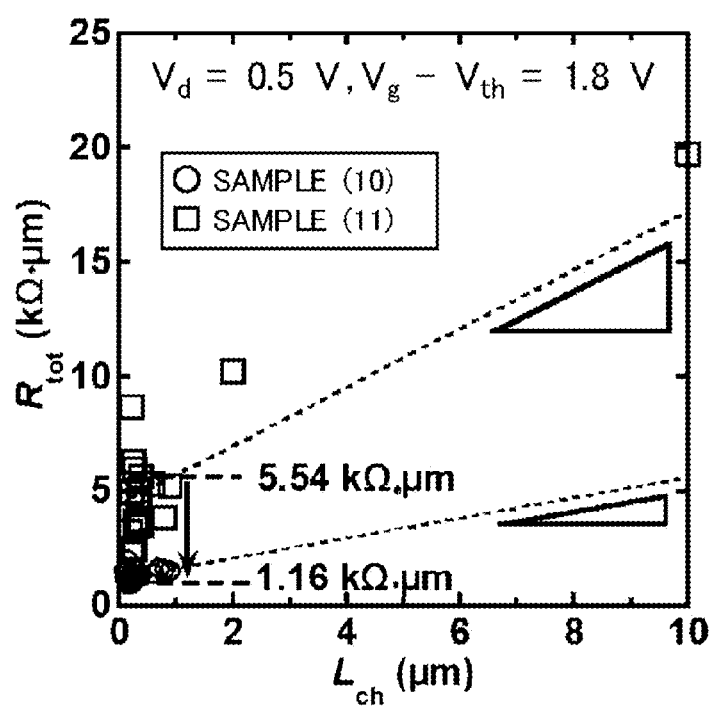
FIG. 35 shows how the total resistance value of the field-effect transistor of the third working example is dependent on the channel length.

FIGS. 30 to 35 respectively show, for the samples (10) and (11), how the threshold voltage (Vth) is dependent on the channel length (FIG. 30), how the S.S. value is dependent on the channel length (FIG. 31), how the DIBL value is dependent on the channel length (FIG. 32), the on-current/off-current characteristics (FIG. 33), how the on-current is dependent on the DIBL value (FIG. 34), and how the total resistance value between the source and the drain is dependent on the channel length (FIG. 35). Here, the threshold was defined as the gate voltage when the drain current was $10^{-6}$ μA/μm, and the DIBL value was evaluated by how the threshold varies depending on the drain voltage.

Figure 31:
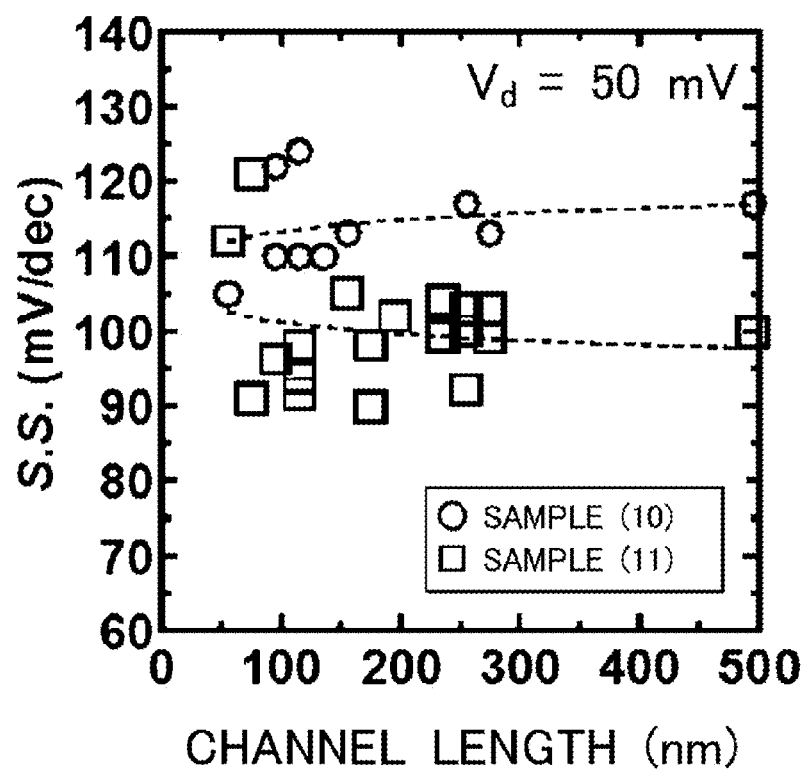
FIG. 31 shows the S.S. value of the field-effect transistor of the third working example is dependent on the channel length.

FIG. 31 shows that neither a rapid change in the threshold value (roll-off) nor a shift of the threshold value into a minus bias is seen for both of the samples (10) and (11). Since the phenomena such as the roll-off are caused by the short channel effects, it was confirmed that the short channel effects were restrained. The short channel effects were restrained probably because an OI structure was obtained by forming a transistor on an insulator layer (BOX layer), which proved that the OI structure was advantageous.

Figure 32:
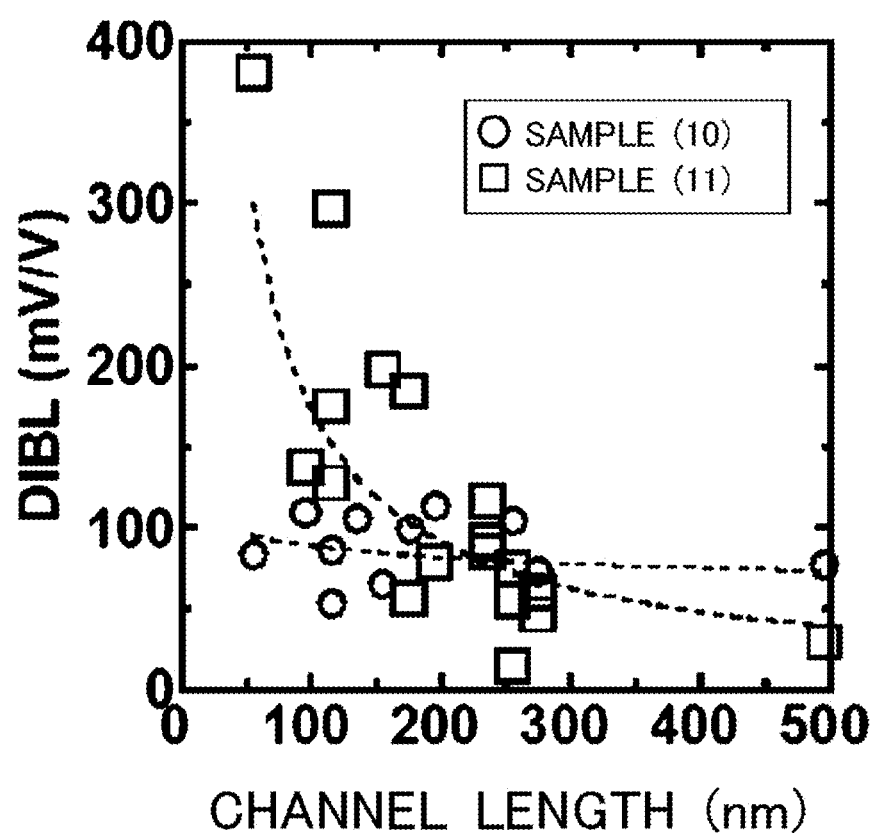
FIG. 32 shows how the DIBL value of the field-effect transistor of the third working example is dependent on the channel length.

FIGS. 32 and 33 show that excellent S.S. and DIBL values are obtained for a short-channel MOSFET having a channel length of approximately several hundred nanometers. When the channel length is 100 nm or less, the sample (10) has a lower DIBL value and considered to be a better choice. It was confirmed that an InAs laminated channel structure (the sample (10)) was advantageous when the channel is short.

FIG. 34 shows that the on-current of the sample (10) was approximately four times as high as the on-current of the sample (11) (when the off-current is 1 nA/μm).

FIG. 35 shows that the on-current of the sample (10) was approximately four times as high as the on-current of the sample (11) (when they have the same DIBL value).

FIG. 35 shows that the parasitic resistance between the source and the drain for the sample (10) was 1.16 kg·μm and that the parasitic resistance between the source and the drain for the sample (11) was 5.54 kg·μm. Here, the parasitic resistance between the source and the drain is defined as the total resistance value $R_{tot}$ between the source and the drain observed when the channel length $L_{ch}$ is zero. Thus, the parasitic resistance of the sample (10) is approximately five times less than the parasitic resistance of the sample (11).

Figure 36:
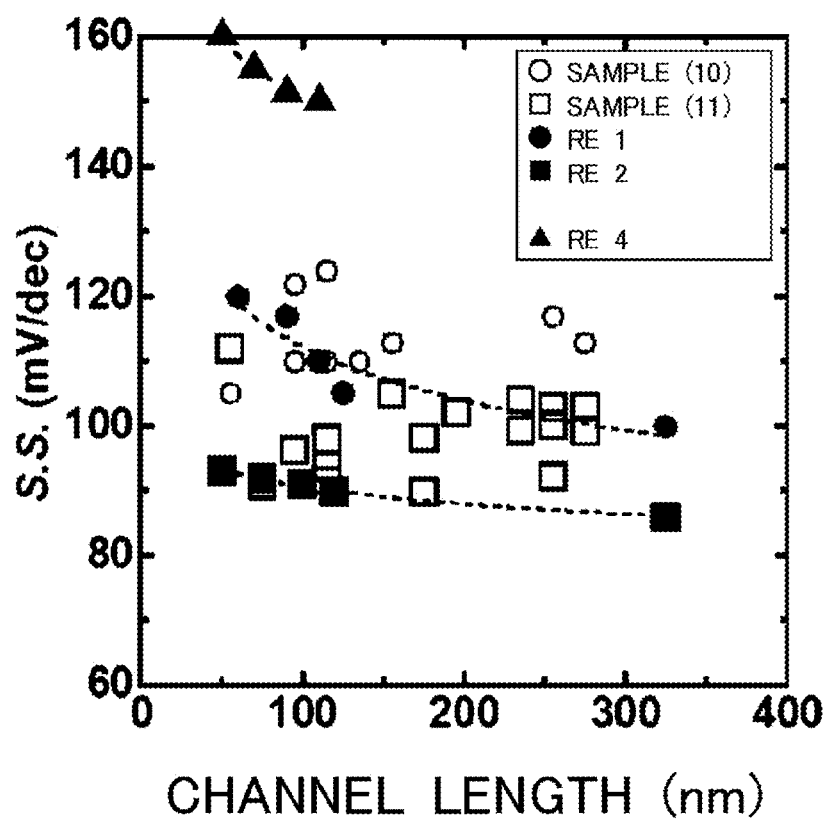
FIG. 36 shows how the S.S. value of the field-effect transistor is dependent on the channel length in the third working example and referential examples.
Figure 37:
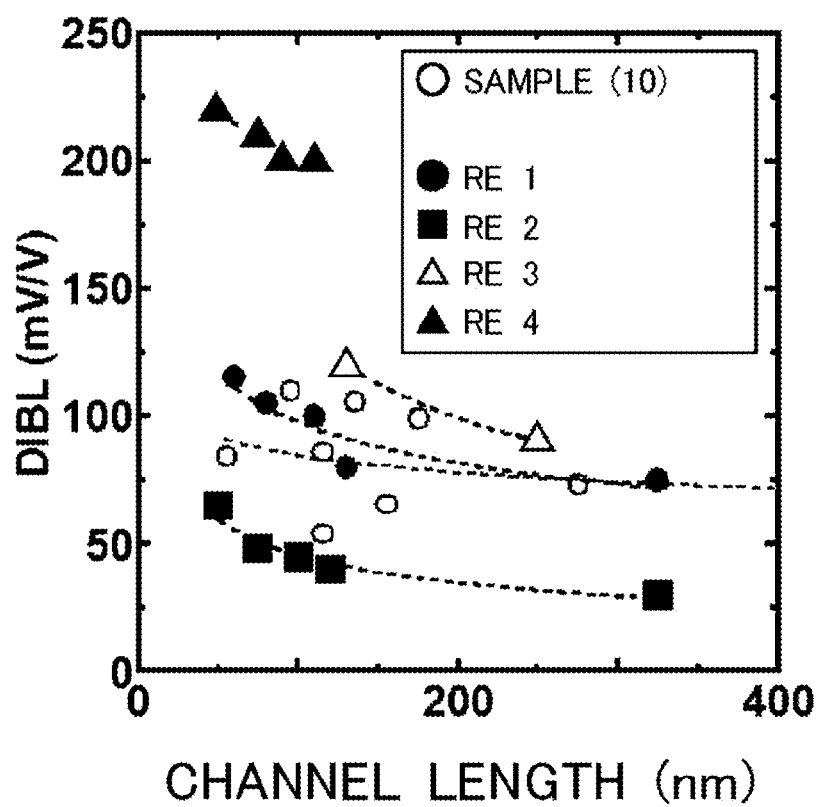
FIG. 37 shows how the DIBL value of the field-effect transistor is dependent on the channel length in the third working example and the referential examples.

FIG. 36 shows how the S.S. value of the field-effect transistor is dependent on the channel length for the samples (10) and (11) and first, second and fourth referential examples. FIG. 37 shows how the DIBL value of the field-effect transistor is dependent on the channel length for the sample (10) and the first to fourth referential examples. Table 1 compares the main constituents and characteristics of the sample (10), which is the third working example and the first to fourth referential examples.

TABLE 1

|  | WE 3 (InAs) | RE 1 tri-gate | RE 2 tri-gate | RE 3 FinFET | RE 4 GAA |
|---|---|---|---|---|---|
| $L_{ch}$ (nm) | 55 | 70 | 60 | 130 | 50 |
| $W_{fin}/H_{fin}$ (nm) | ETB planar | 60/50 | 40/40 | 220/100 | 30/30 |
| EOT (nm) | ~3.5 | 1.2 | 1.2 | 3.8 | ~7 |
| $I_{on}$ (μA/μm) at $V_G - V_{th} = V_D = 0.5$ V | 278 | ~300 | ~400 | ~80 | ~180 |
| S.S. (mV/dec) | 105 | 120 | 90 | 230 | 150 |
| DIBL (mV/V) | 84 | 110 | 60 | 120 | 210 |

In Table 1, WE stands for a working example and RE stands for a referential example.

Here, the first to fourth referential examples are the transistors disclosed in the following documents and respectively have a three-dimensional gate structure such as a tri-gate structure, a fin structure, or a gate-all-around structure.

First Referential Example: M. Radosavljevic et al., 2010 IEDM, pp. 126-129

Second Referential Example: M. Radosavljevic et al., 2011 IEDM, pp. 765-768

Third Referential Example: H. C. Chin et al., EDL 32, 2 (2011)

Fourth Referential Example: J. J. Gu et al., 2011 IEDM, pp. 769-772

FIGS. 36 and 37 and Table 1 indicate that the sample (10) is a MOSFET having a planar gate structure but achieves as high performance as or higher performance than a transistor with a 3D gate structure.

As used herein, the sentence "a first element such as a layer, a region or a wafer is on a second element" means that the first element is directly on the second element and also means that the first element is indirectly on the second element with another element being provided between the first element and the second element. Furthermore, the expression "the portion of the semiconductor layer 106 exposed though the opening" means a portion of the semiconductor layer 106 that forms the bottom of the opening. When the field-effect transistor is an n-channel field-effect transistor, the relation between the electron affinities of the layers described herein may be reversed.

DESCRIPTION OF REFERENCE NUMERALS 100 semiconductor wafer, 102 base wafer, 104 first insulator layer. 106 semiconductor layer, 108 first crystal layer, 110 second crystal layer, 120 semiconductor layer-forming wafer, 122 argon beam, 200 field-effect transistor, 202 source electrode, 204 drain electrode, 206 source region, 208 drain region, 210 second insulator layer, 211 metal layer, 212 gate electrode, 220 metal film, 300 semiconductor wafer, 302 third crystal layer, 400 field-effect transistor, 500 field-effect transistor, 502 back gate electrode, 600 field-effect transistor

What is claimed is:

1. A semiconductor wafer comprising:
a base wafer;
a first insulating layer; and
a semiconductor layer; wherein
the base wafer, the first insulating layer and the semiconductor layer are arranged in an order from the base wafer to the first insulating layer to the semiconductor layer,
the first insulating layer is made of an amorphous metal oxide or an amorphous metal nitride,
the semiconductor layer includes a first crystal layer, a second crystal layer, and a third crystal layer,
the first crystal layer, the second crystal layer and the third crystal layer are arranged in order from the third crystal layer to the first crystal layer to the second crystal layer in such a manner that the third crystal layer is positioned closest to the base wafer, and the first crystal layer is positioned closer to the base wafer than the second crystal layer,
the electron affinity $E_{a1}$ of the first crystal layer is larger than the electron affinity $E_{a2}$ of the second crystal layer, and
the electron affinity $E_{a3}$ of the third crystal layer is smaller than the electron affinity $E_{a1}$ of the first crystal layer.

2. The semiconductor wafer as set forth in claim 1, wherein the first crystal layer is made of $In_{x1}Ga_{1-x1}As$ (0<x1<1), the second crystal layer is made of $In_{x2}Ga_{1-x2}As$ (0<x2<1), the third crystal layer is made of $In_{x3}Ga_{1-x3}As$ (0<x3<1), and the relation of x1>x2 and the relation of x1>x3 are satisfied.

3. The semiconductor wafer as set forth in claim 1, wherein the semiconductor layer has the thickness of 20 nm or less.

4. A field-effect transistor comprising the semiconductor wafer as set forth in claim 1, wherein
the field-effect transistor includes a source electrode and a drain electrode that are electrically connected to the semiconductor layer of the semiconductor wafer.

5. The field-effect transistor as set forth in claim 4, wherein the semiconductor layer includes a source region in contact with the source electrode or a drain region in contact with the drain electrode, and
the source region or the drain region contains an alloy of (i) at least one type of atom selected from the group consisting of a Group III atom and a Group V atom that make the semiconductor layer and (ii) a metal atom.

6. The field-effect transistor as set forth in claim 5, wherein the metal atom is a nickel atom.

7. The field-effect transistor as set forth in claim 5, wherein the field-effect transistor includes a gate electrode on a side of the semiconductor layer that faces away from the base wafer, and an interface of the source region that is positioned closer to the drain region and an interface of the drain region that is positioned closer to the source region are formed in an under-gate electrode region that is a region of the semiconductor layer that is sandwiched between the gate electrode and the base wafer.

8. The field-effect transistor as set forth in claim 5, wherein the field-effect transistor is an n-channel field-effect transistor, and the source region or the drain region further contains a donor impurity atom.

9. The field-effect transistor as set forth in claim 5, wherein the field-effect transistor is a p-channel field-effect transistor, and the source region or the drain region further contains an acceptor impurity atom.

* * * * *